(12) United States Patent
Lee et al.

(10) Patent No.: US 11,854,979 B2
(45) Date of Patent: Dec. 26, 2023

(54) SEMICONDUCTOR DEVICE

(71) Applicant: Samsung Electronics Co., Ltd., Suwon-si (KR)

(72) Inventors: Jang Eun Lee, Hwaseong-si (KR); Min Joo Lee, Seoul (KR); Wan Don Kim, Seongnam-si (KR); Hyeon Jin Shin, Suwon-si (KR); Hyun Bae Lee, Seoul (KR); Hyun Seok Lim, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 293 days.

(21) Appl. No.: 17/379,000

(22) Filed: Jul. 19, 2021

(65) Prior Publication Data
US 2022/0084952 A1  Mar. 17, 2022

(30) Foreign Application Priority Data

Sep. 11, 2020 (KR) .................. 10-2020-0116954

(51) Int. Cl.
*H01L 23/532* (2006.01)
*H10B 12/00* (2023.01)
*H01L 21/768* (2006.01)

(52) U.S. Cl.
CPC .. *H01L 23/53252* (2013.01); *H01L 23/53276* (2013.01); *H10B 12/0335* (2023.02); *H10B 12/315* (2023.02); *H10B 12/482* (2023.02); *H01L 21/76885* (2013.01)

(58) Field of Classification Search
CPC ........ H01L 23/53252; H01L 23/53276; H10B 12/482; H10B 12/0335; H10B 12/315
See application file for complete search history.

(56) References Cited

U.S. PATENT DOCUMENTS

| 8,685,851 | B2 | 4/2014 | Zhao et al. |
| 8,716,863 | B2 | 5/2014 | Wann et al. |
| 8,895,433 | B2 | 11/2014 | Bonilla et al. |
| 9,202,743 | B2 | 12/2015 | Bao et al. |

(Continued)

OTHER PUBLICATIONS

German Office Action dated Jul. 19, 2023 issued in German Patent Application No. 10 2021 115 695.5. English translation has been provided.

(Continued)

*Primary Examiner* — Peniel M Gumedzoe
(74) *Attorney, Agent, or Firm* — Harness, Dickey & Pierce, P.L.C.

(57) ABSTRACT

A semiconductor device is provided. The semiconductor device includes a substrate including an element isolation layer, the element isolation layer defining an active region, a plurality of word lines traversing the active region in a first direction, and a plurality of bit line structures on the substrate and connected to the active region, the plurality of bit line structures extending in a second direction different from the first direction. Each of the plurality of bit line structures includes a ruthenium line wiring including a bottom surface and a top surface opposite to the bottom surface, a lower graphene layer in contact with the bottom surface of the ruthenium line wiring and extending along the bottom surface of the ruthenium line wiring, and a wiring line capping layer extending along the top surface of the ruthenium line wiring.

17 Claims, 27 Drawing Sheets

(56) References Cited

U.S. PATENT DOCUMENTS

| | | |
|---|---|---|
| 9,324,634 B2 | 4/2016 | Bao et al. |
| 9,431,345 B2 | 8/2016 | Sakata et al. |
| 9,484,302 B2 | 11/2016 | Yang et al. |
| 2014/0145332 A1 | 5/2014 | Ryan et al. |
| 2018/0166450 A1 | 6/2018 | Kim et al. |
| 2018/0350741 A1 | 12/2018 | Lee et al. |
| 2019/0131408 A1 | 5/2019 | Yang et al. |
| 2019/0164781 A1* | 5/2019 | Tien ............... H01L 21/76852 |
| 2020/0161294 A1* | 5/2020 | Lee ............... H10B 12/482 |

OTHER PUBLICATIONS

Swati Achra, et al. "Graphene-Ruthenium hybrid interconnects," International Interconnect Technology Conference, Session 4, pp. 1-4 (2019).

* cited by examiner

SEMICONDUCTOR DEVICE

CROSS-REFERENCE TO RELATED APPLICATION

This application claims priority from Korean Patent Application No. 10-2020-0116954 filed on Sep. 11, 2020 in the Korean Intellectual Property Office, and all the benefits accruing therefrom under 35 U.S.C. § 119, the contents of which in its entirety are herein incorporated by reference.

BACKGROUND

Some example embodiments relate to a semiconductor device, and more particularly, to a semiconductor device using a capacitor as a data storage element.

As a semiconductor device becomes more highly integrated, individual circuit patterns have become more miniaturized to realize more semiconductor devices within the same area. For example, as the integration density of a semiconductor device increases, the design rule for components of the semiconductor device decreases.

In a highly scaled semiconductor device, as a critical dimension (CD) of an electrode becomes smaller, many studies on a new technique of the integration density are being conducted.

SUMMARY

According to some example embodiments of inventive concepts, there is provided a semiconductor device including a substrate including an element isolation layer, the element isolation layer defining an active region, a plurality of word lines traversing the active region in a first direction, and a plurality of bit line structures on the substrate and connected to the active region, the plurality of bit line structures extending in a second direction different from the first direction. Each of the plurality of bit line structures includes a ruthenium line wiring including a bottom surface and a top surface opposite to the bottom surface, a lower graphene layer in contact with the bottom surface of the ruthenium line wiring and extending along the bottom surface of the ruthenium line wiring, and a wiring line capping layer extending along the top surface of the ruthenium line wiring.

According to some example embodiments of inventive concepts, there is provided a semiconductor device including a substrate including an element isolation layer, the element isolation layer defining an active region, a plurality of word lines traversing the active region in a first direction, and a plurality of bit line structures extending in a second direction different from the first direction on the substrate and connected to the active region. Each of the plurality of bit line structures includes a ruthenium line wiring including a bottom surface and a top surface opposite to the bottom surface, an upper graphene layer in contact with the top surface of the ruthenium line wiring and extending along the top surface of the ruthenium line wiring, and a wiring line capping layer on the upper graphene layer and extending along the upper graphene layer.

According to some example embodiments of inventive concepts, there is provided a semiconductor device including a substrate including an element isolation layer, the element isolation layer defining an active region, a plurality of word lines traversing the active region in a first direction, and a plurality of bit line structures on the substrate and connected to the active region, the plurality of bit line structures extending in a second direction different from the first direction. Each of the plurality of bit line structures includes a ruthenium line wiring including a bottom surface and a top surface opposite to the bottom surface, a lower graphene layer contacting the bottom surface of the ruthenium line wiring and extending along the bottom surface of the ruthenium line wiring, an upper graphene layer in contact with the top surface of the ruthenium line wiring and extending along the top surface of the ruthenium line wiring, and a wiring line capping layer on the upper graphene layer and extending along the upper graphene layer.

However, aspects of inventive concepts are not restricted to the one set forth herein. The above and other aspects of inventive concepts will become more apparent to one of ordinary skill in the art to which inventive concepts pertains by referencing the detailed description of inventive concepts given below.

BRIEF DESCRIPTION OF THE DRAWINGS

The above and other aspects and features of inventive concepts will become more apparent by describing in detail some example embodiments thereof with reference to the attached drawings, in which.

DETAILED DESCRIPTION OF SOME EXAMPLE EMBODIMENTS

Figure 1:
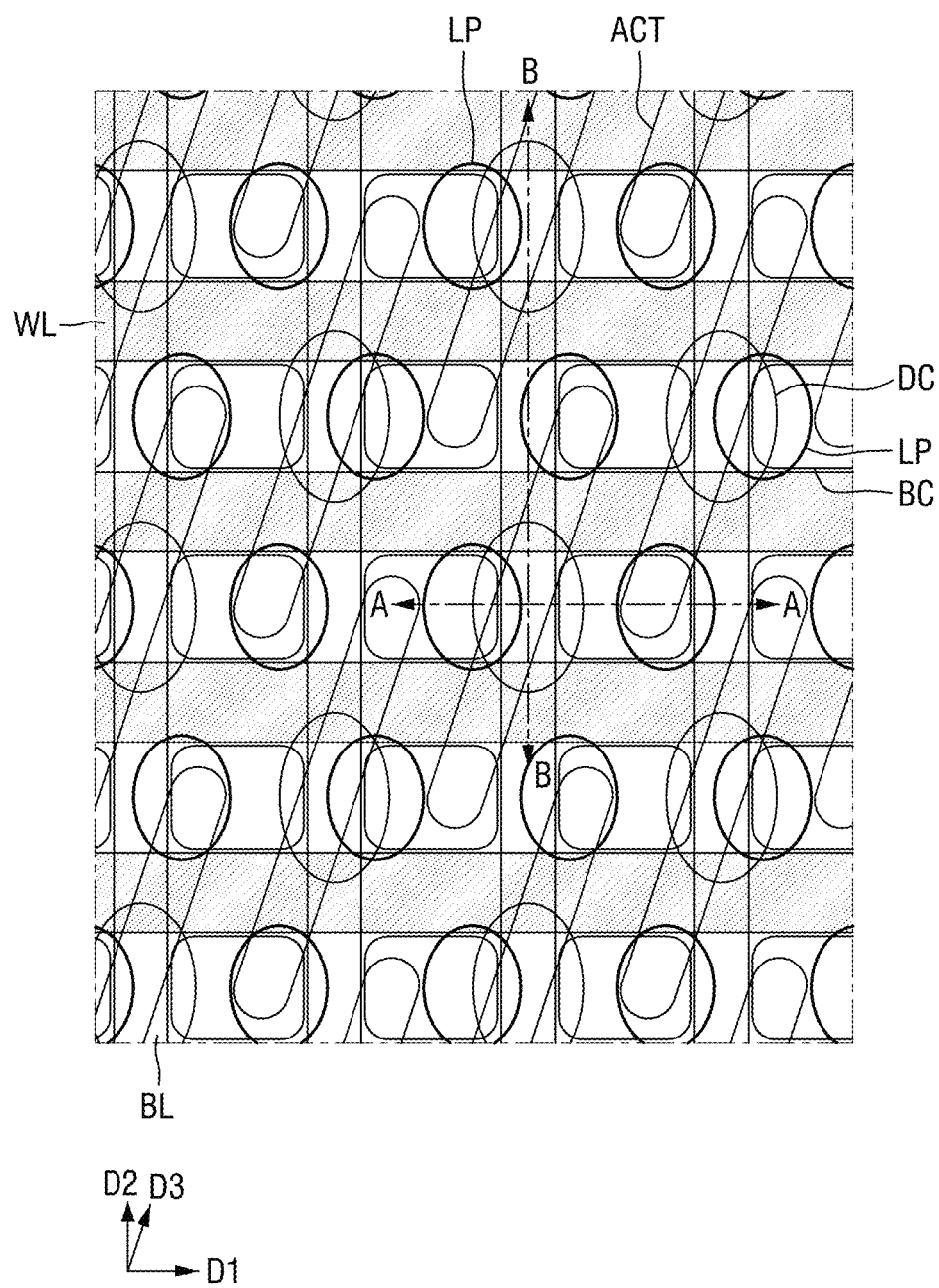
FIG. 1 is a schematic layout diagram illustrating a semiconductor device according to some example embodiments.

FIG. 1 is a schematic layout diagram illustrating a semiconductor device according to some example embodiments.

Figure 2:
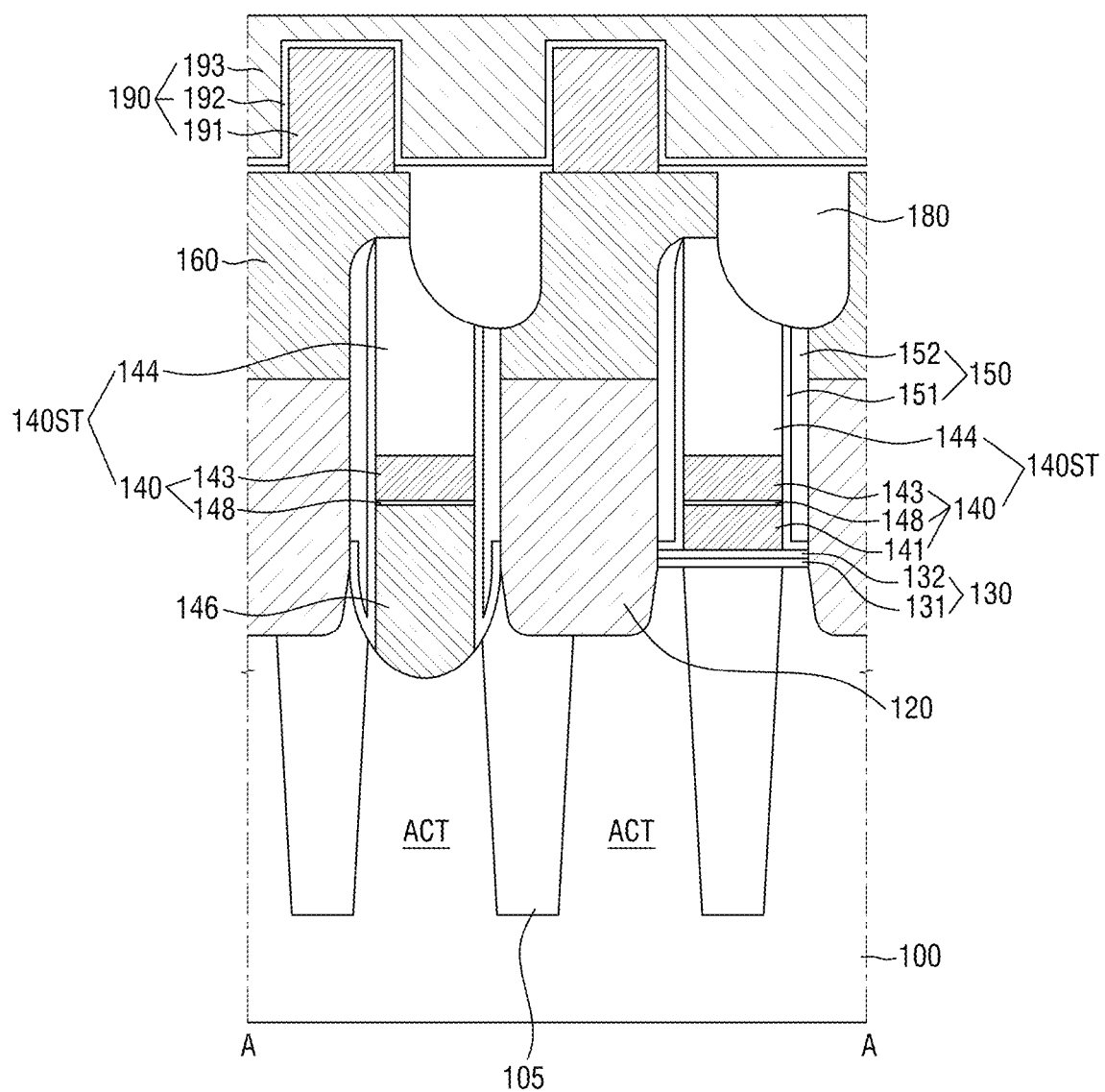
FIG. 2 is a cross-sectional view taken along line A-A of FIG. 1.
Figure 3:
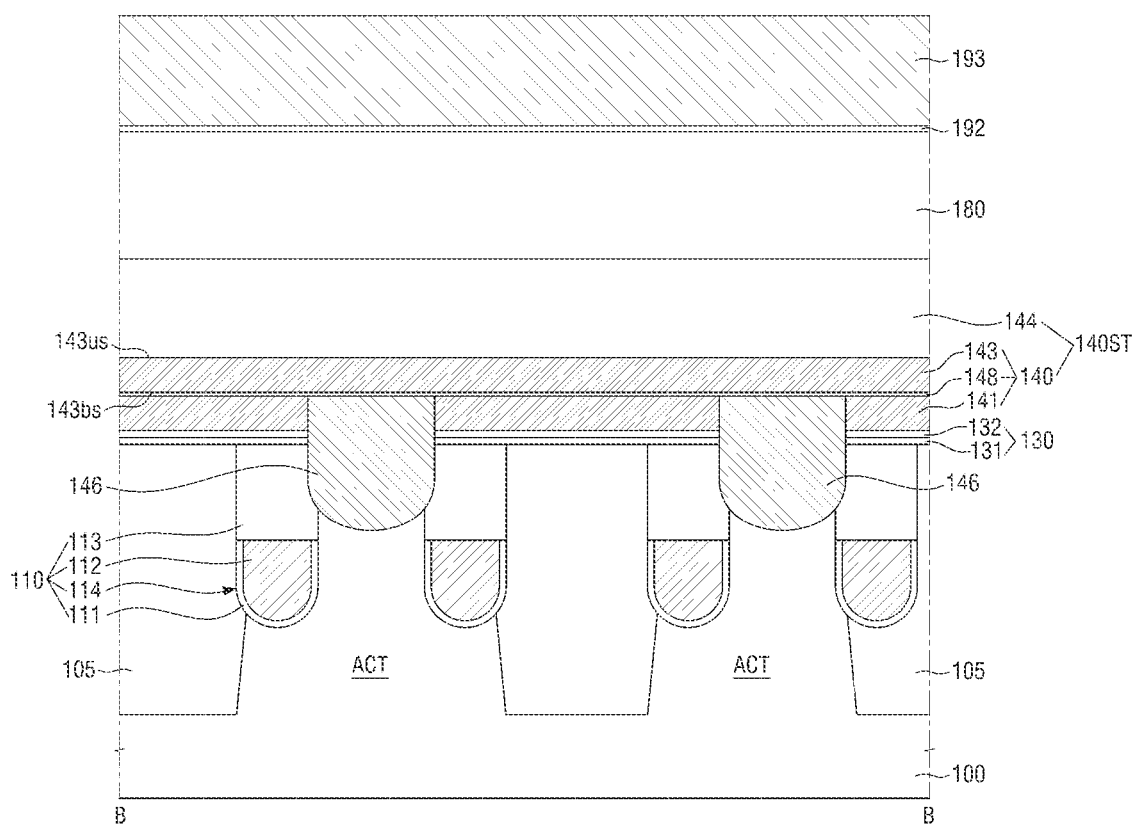
FIG. 3 is a cross-sectional view taken along line B-B of FIG. 1.

FIG. 2 is a cross-sectional view taken along line A-A of FIG. 1. FIG. 3 is a cross-sectional view taken along line B-B of FIG. 1.

Although FIG. 1 illustrates an example layout diagram of a dynamic random access memory (DRAM) excluding a capacitor 190, inventive concepts are not limited thereto.

Referring to FIG. 1, a semiconductor device according to some example embodiments may include a plurality of active regions ACT. The active region ACT may be defined by an element isolation layer 105 (see FIG. 1) formed in a substrate 100 (see FIG. 2).

As the design rule of the semiconductor device decreases, as illustrated, the active region AR may be disposed in a diagonal or oblique bar shape. The active region ACT may have a bar shape extending in a third direction D3. A plurality of active regions ACT may extend collinearly along the third direction D3.

On the active regions ACT, a plurality of gate electrodes may be arranged in a first direction D1 across the active regions ACT. The plurality of gate electrodes may extend in parallel to each other. The plurality of gate electrodes may be or correspond to, for example, a plurality of word lines WL.

The word lines WL may be arranged at equal intervals. The width of the word line WL, the spacing between adjacent word lines WL, and/or the interval between the word lines WL (e.g. the pitch of the word lines WL) may be determined according to the design rule.

On the word lines WL, a plurality of bit lines BL extending in a second direction D2 perpendicular to the word lines WL may be disposed. The plurality of bit lines BL may extend in the second direction D2 across the active regions ACT. The second direction D2 may be at right angles with the first direction D1; however, example embodiments are not limited thereto. Furthermore the third direction D3 may be at an angle other than a right angle with the first direction D1, for example at an angle of 45 degrees and/or 70 degrees; however, example embodiments are not limited thereto. The bit lines BL may also be referred to as digit lines.

The plurality of bit lines BL may extend in parallel to each other. The bit lines BL may be arranged at equal intervals. The width of the bit line BL, the spacing between adjacent bit lines BL, and/or the interval between the bit lines BL (e.g. the pitch) may be determined according to the design rule.

The semiconductor device according to some example embodiments may include various contact arrangements formed on the active regions ACT. Various contact arrangements may include, for example, digit line contacts (DC), buried contacts (BC), landing pads (LP), and/or the like.

Here, the digit line contact DC may refer to a contact electrically connecting, e.g. directly connecting, the active region ACT to the bit line BL. The buried contact BC may refer to a contact connecting, e.g. directly connecting the active region ACT to a lower electrode 191 (see FIG. 2) of the capacitor 190 (see FIG. 2).

In the arrangement structure, the contact area between the buried contact BC and the active region ACT may be small. Accordingly, in order to increase the contact area with the active region ACT and to increase the contact area with the lower electrode 191 (see FIG. 2), a conductive landing pad LP may be introduced. The increase in contact area may lead to a decrease in resistance between the buried contact BC and the active region ACT.

The landing pad LP may be disposed between the active region ACT and the buried contact BC, or may be disposed between the buried contact BC and the lower electrode 191 (see FIG. 2) of the capacitor 190. In the semiconductor device according to some example embodiments of inventive concepts, the landing pad LP may be disposed between the buried contact BC and the lower electrode 191 (see FIG. 2) of the capacitor. By expanding the contact area through the introduction of the second landing pad LP, the contact resistance between the active region ACT and the lower electrode 191 (see FIG. 2) of the capacitor can be reduced. A speed of the semiconductor device may be increased with a reduction in contact resistance.

In the semiconductor device according to some example embodiments, the digit line contact DC may be disposed in a central portion of the active region ACT. The buried contacts BC may be disposed at both ends of the active region ACT.

As the buried contacts BC are disposed at both ends of the active region ACT, the landing pads LP may be disposed adjacent to both ends of the active region ACT to partially overlap the buried contacts BC.

For example, the buried contacts BC may be formed to overlap the element isolation layer 105 (see FIG. 2) and the active regions ACT between the adjacent word lines WL and between the adjacent bit lines BL.

The word lines WL may be formed to be buried in the substrate 100. The word lines WL may be disposed across the active regions ACT between the digit line contacts DC or the buried contacts BC.

As illustrated, two word lines WL may be disposed to traverse one active region ACT. Since the active region ACT is disposed in an oblique shape, the word line WL may have an angle of less than 90 degrees with respect to the active region ACT.

The digit line contacts DC and the buried contacts BC may be arranged symmetrically. Accordingly, the digit line contacts DC and the buried contacts BC may be disposed in a straight line (e.g. collinearly) along the first direction D1 and the second direction D2.

On the other hand, unlike the digit line contacts DC and the buried contacts BC, the landing pads LP may be arranged in a zigzag shape in the second direction DR2 in which the bit line BL extends. Further, the landing pads LP may be disposed to overlap the same side surface of each bit line BL in the first direction D1 in which the word line WL extends.

For example, each of the landing pads LP in a first line may overlap a left side surface of the corresponding bit line BL, and each of the landing pads LP in a second line may overlap a right side surface of the corresponding bit line BL.

Referring to FIGS. 1 to 3, the semiconductor device according to some example embodiments may include the element isolation layer 105, a plurality of gate structures 110, a plurality of bit line structures 140ST, a bit line contact 146, a storage contact 120, and an information storage unit 190.

The substrate 100 may be or may include a silicon substrate or silicon-on-insulator (SOI) substrate. Alternatively, the substrate 100 may include silicon germanium, silicon germanium on insulator (SGOI), indium antimonide, a lead tellurium compound, indium arsenide, indium phosphide, gallium arsenide, or gallium antimonide, but is not limited thereto. The substrate 100 may be doped, e.g. may be lightly doped with impurities such as phosphorus; however, example embodiments are not limited thereto.

The element isolation layer 105 may be formed in the substrate 100. The element isolation layer 105 may have a shallow trench isolation (STI) structure having good, e.g. excellent element isolation (or electrical isolation) characteristics. The element isolation layer 105 may define the active region ACT in the substrate 100. The element isolation layer 105 may be included in the substrate 100.

The active region ACT defined by the element isolation layer 105 may have a long island shape having a short axis and a long axis, as shown in FIG. 1. The active region ACT may have an oblique shape to have an angle of less than 90 degrees with respect to the word line WL formed in the element isolation layer 105.

Further, the active region ACT may have an oblique shape to have an angle of less than 90 degrees with respect to the bit line BL formed on the element isolation layer 105. For example, the active region ACT may extend in a third direction D3 having a specific (or, alternatively, predetermined) angle with respect to the first and second directions D1 and D2.

The element isolation layer 105 may include, for example, at least one of a silicon oxide layer, a silicon nitride layer, or a silicon oxynitride layer, but inventive concepts are not limited thereto. Although it is illustrated that the element isolation layer 105 is a single layer, inventive concepts are not limited thereto. Although not shown, as an example, the element isolation layer 105 may include an insulating liner and a filling insulating layer filling a trench defined by the insulating liner. The element isolation layer 105 may be formed with a deposition process such as a high-density plasma (HDP) chemical vapor deposition (CVD) process and/or a spin-on glass (SOG) process.

In FIG. 2, it is shown that the top surface of the element isolation layer 105 and the top surface of the substrate 100 corresponding to the active regions ACT are at the same level, e.g. lie on the same plane. However, this is merely for simplicity of description, and inventive concepts are not limited thereto.

The gate structures 110 may be formed in the substrate 100 and the element isolation layer 105. The gate structures 110 may be formed across the element isolation layer 105 and the active regions ACT defined by the element isolation layer 105. For example, one gate structure 110 may be formed in the element isolation layer 105 and the substrate 100 positioned in the first direction D1 in which the gate structure 110 extends.

The gate structure 110 may include a gate trench 114 formed in the substrate 100 and the element isolation layer 105, a gate insulating layer 111, a gate electrode 112, and a gate capping pattern 113. Here, the gate electrode 112 may correspond to the word line WL.

The gate insulating layer 111 may extend along the sidewall and bottom surface of the gate trench 114. The gate insulating layer 111 may extend along at least a part of the profile of the gate trench 114.

The gate insulating layer 111 may include at least one of silicon oxide, silicon nitride, silicon oxynitride, or a high-k material having a higher dielectric constant than silicon oxide. The high-k material may include, for example, at least one selected from the group consisting of boron nitride, hafnium oxide, hafnium silicon oxide, hafnium aluminum oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, lead zinc niobate, and a combination thereof. The gate insulating layer 111 may be formed with an oxidation process such as an in-situ steam generation (ISSG) process; however, example embodiments are not limited thereto.

The above-mentioned high-k material has been described focusing on oxide. However, the high-k material may include one or more of nitride (e.g., hafnium nitride) or oxynitride (e.g., hafnium oxynitride) of the above metallic material (e.g., hafnium), but is not limited thereto.

The gate electrode 112 may be formed on the gate insulating layer 111. The gate electrode 112 may fill a part of the gate trench 114.

The gate electrode 112 may include at least one of metal, conductive metal nitride, conductive metal carbonitride, conductive metal carbide, metal silicide, a doped semiconductor material such as doped poly-silicon, conductive metal oxynitride, or conductive metal oxide. The gate electrode 112 may include, for example, at least one selected from the group consisting of or including titanium nitride (TiN), tantalum carbide (TaC), tantalum nitride (TaN), titanium silicon nitride (TiSiN), tantalum silicon nitride (TaSiN), tantalum titanium nitride (TaTiN), titanium aluminum nitride (TiAlN), tantalum aluminum nitride (TaAlN), tungsten nitride (WN), ruthenium (Ru), titanium aluminum (TiAl), titanium aluminum carbonitride (TiAlC—N), titanium aluminum carbide (TiAlC), titanium carbide (TiC), tantalum carbonitride (TaCN), tungsten (W), aluminum (Al), copper (Cu), cobalt (Co), titanium (Ti), tantalum (Ta), nickel (Ni), platinum (Pt), nickel platinum (Ni—Pt), niobium (Nb), niobium nitride (NbN), niobium carbide (NbC), molybdenum (Mo), molybdenum nitride (MoN), molybdenum carbide (MoC), tungsten carbide (WC), rhodium (Rh), palladium (Pd), iridium (Ir), osmium (Os), silver (Ag), gold (Au), zinc (Zn), vanadium (V) and a combination thereof.

The gate capping pattern 113 may be formed on the gate electrode 112. The gate capping pattern 113 may fill the remaining part of the gate trench 114 in which the gate electrode 112 is formed. The gate capping pattern 113 may include, for example, at least one of silicon nitride (SiN), silicon oxynitride (SiON), silicon oxide (SiO$_2$), silicon carbonitride (SiCN), silicon oxycarbonitride (SiOCN), or a combination thereof.

In FIG. 3, it is shown that the top surface of the gate capping pattern 113 and the top surface of the element isolation layer 105 lie on the same plane. However, this is merely for simplicity of description, and inventive concepts are not limited thereto.

In addition, the gate insulating layer 111 is shown not to extend to the top surface of the gate capping pattern 113, but is not limited thereto.

Although not shown, an impurity doped region may be formed on at least one side of the gate structure 110. The impurity doped region may be or correspond to a source/drain region of a transistor. The impurity doped region may be doped with an impurity, such as at least one of boron, phosphorus, arsenic, carbon, or germanium; however, example embodiments are not limited thereto.

The bit line structure 140ST may include a wiring structure 140 and a wiring line capping layer 144.

The wiring structure 140 may be formed above the element isolation layer 105 and the substrate 100 in which the gate structures 110 are formed. The wiring structure 140 may cross the element isolation layer 105 and the active regions ACT defined by the element isolation layer 105.

For example, one wiring structure 140 may be formed above the element isolation layer 105 and the substrate 100 positioned in the second direction D2 in which the wiring structure 140 extends. The wiring structure 140 may be formed to cross the gate structures 110. Here, the wiring structure 140 may be or correspond to the bit line BL.

The wiring structure 140 may include a first line wiring 143, a second line wiring 141, and a lower barrier layer 148.

The first line wiring 143 may be disposed above the substrate 100 and the element isolation layer 105. The first line wiring 143 may be elongated, e.g. may extend, along the second direction D2.

The first line wiring 143 may include a top surface 143*us* and a bottom surface 143*bs* opposite to each other. The top surface 143*us* of the first line wiring and the bottom surface 143*bs* of the first line wiring may be parallel to the top surface of the substrate 100.

As the semiconductor device is down-scaled or shrunk, the width of the first line wiring 143 (width in the first direction D1) may decrease.

In general, by using a material having a small bulk resistivity and/or a large electron mean free path (eMFP) for the wiring, the performance of the semiconductor device may be improved. However, when the width of the wiring is less than or equal to 12 nm, the resistance of the wiring may increase by using the material having a large electron mean free path (eMFP) for the wiring. As the width of the wiring decreases, the number of times that electrons in the material having a large electron mean free path (eMFP) collide with the surface of the wiring may increase. Due to the increase in the number of collisions, the resistance of the wiring may increase, thereby deteriorating the performance, e.g. speed and/or power, of the semiconductor device.

As the semiconductor device is down-scaled or shrunk, the width of the wiring of the bit line BL (see FIG. 1) also decreases. In order to improve the performance of the semiconductor device, a material having a small electron mean free path (eMFP) and a small bulk resistivity needs or is chosen to be used for the wiring of the bit line.

The first line wiring 143 may include, for example, at least one of ruthenium (Ru), rhodium (Rh), iridium (Ir), molybdenum (Mo), RuAl, NiAl, NbB2, MoB2, TaB2, V2AlC or CrAlC. In the semiconductor device according to some example embodiments, the first line wiring 143 may include or consist of ruthenium. For example, the first line wiring 143 may be or correspond to a ruthenium line wiring.

The lower barrier layer 148 may be disposed between the first line wiring 143 and the substrate 100. The lower barrier layer 148 may extend along the bottom surface 143*bs* of the first line wiring. The lower barrier layer 148 may contact the first line wiring 143.

The lower barrier layer 148 may include, for example, at least one of graphene or magnesium oxide (MgO). In the semiconductor device according to some example embodiments, the lower barrier layer 148 may include graphene, e.g. at least one monolayer of graphene. For example, a thickness of the lower barrier layer may be between 0.334 nm to 3.185 nm; however, example embodiments are not limited thereto. For example, the lower barrier layer 148 may be or correspond to a lower graphene layer.

When the lower barrier layer 148 is a lower graphene layer, the lower barrier layer 148 may increase the size of crystal grains of a metal material included in the first line wiring 143. For example, a case where the first line wiring 143 is a ruthenium line wiring will be described; however, example embodiments are not limited thereto.

The crystal grain size of a ruthenium layer formed on the graphene layer is larger than the crystal grain size of a ruthenium layer formed without the graphene layer. As the crystal grain size increases, a grain boundary between the crystal grains may decrease. Since the grain boundary may act as resistance of electron transfer, as the crystal grain size of the ruthenium layer increases, the resistance of the ruthenium layer may decrease. For example, the lower graphene layer may reduce the resistance of the first line wiring 143.

Alternatively or additionally, when the lower barrier layer 148 is a lower graphene layer, the lower graphene layer may improve current spreading between the wiring structure 140 and the bit line contact 146.

The second line wiring 141 may be disposed between the lower barrier layer 148 and the substrate 100. The second line wiring 141 may extend in the second direction D2 along the lower barrier layer 148.

The second line wiring 141 may include, for example, a semiconductor material doped with impurities. The second line wiring 141 may include, for example, at least one of impurity-doped silicon, impurity-doped silicon germanium, or impurity-doped germanium, and may be in polycrystalline phase; however, example embodiments are not limited thereto.

In the semiconductor device according to some example embodiments, the wiring structure 140 may include the second line wiring 141, the lower barrier layer 148, and the first line wiring 143, which are sequentially stacked on the substrate 100.

The bit line contact 146 may be formed between the wiring structure 140 and the substrate 100. For example, the wiring structure 140 may be formed on the bit line contact 146.

For example, the bit line contact 146 may be formed at a point where the wiring structure 140 intersects a central portion of the active region ACT having a long island shape. The bit line contact 146 may be formed between the wiring structure 140 and the substrate 100 in the central portion of the active region ACT.

The bit line contact 146 may electrically connect the wiring structure 140 to the substrate 100. The bit line contact 146 may electrically connect the wiring structure 140 to the active region ACT. For example, the bit line structure 140ST may be connected to the active region ACT through the bit line contact 146.

More specifically, the bit line contact 146 may electrically connect the impurity doped region of the substrate 100 between the adjacent gate structures 110 to the wiring structure 140. Here, the bit line contact 146 may correspond to the digit line contact (DC) described above with respect to FIG. 2.

For example, the depth from the top surface of the gate capping pattern 113 to the bottom surface of the bit line contact 146 is smaller than the depth from the top surface of the gate capping pattern 113 to the top surface of the gate electrode 112.

The bit line contact 146 may include, for example, at least one of a semiconductor material doped with impurities, a conductive silicide compound, conductive metal nitride, or metal. In the semiconductor device according to some example embodiments, the bit line contact 146 may include a semiconductor material doped with impurities.

In FIG. 3, in a region overlapping the top surface of the bit line contact 146, the wiring structure 140 may include the first line wiring 143 and the lower barrier layer 148. In a region not overlapping with the top surface of the bit line contact 146, the wiring structure 140 may include the first line wiring 143, the lower barrier layer 148, and the second line wiring 141. In a manufacturing/fabrication process, when the second line wiring 141 is formed above the substrate 100 and then the bit line contact 146 penetrating the second line wiring 141 is formed, a shape as described above may appear.

Unlike the illustrated example, in a region overlapping the top surface of the bit line contact 146, the wiring structure 140 may include the first line wiring 143, the lower barrier layer 148, and the second line wiring 141. In a manufacturing/fabrication process, when the bit line contact 146 is formed and then the second line wiring 141 is formed on the bit line contact 146 and the substrate 100, a shape different from that shown in FIG. 3 may appear.

The wiring line capping layer 144 may be disposed on the wiring structure 140. The wiring line capping layer 144 may extend in the second direction D2 along the top surface 143us of the first line wiring. In this case, the wiring line capping layer 144 may include, for example, at least one of a silicon nitride layer, a silicon oxynitride layer, or a silicon oxide layer, but example embodiments are not limited thereto.

A cell insulating layer 130 may be formed on the substrate 100 and the element isolation layer 105. More specifically, the cell insulating layer 130 may be formed on the element isolation layer 105 and the substrate 100 on which the bit line contact 146 is not formed.

The cell insulating layer 130 may be formed between the substrate 100 and the wiring structure 140, and between the element isolation layer 105 and the wiring structure 140.

The cell insulating layer 130 may be a single layer, but as shown, the cell insulating layer 130 may be a multilayer including a first cell insulating layer 131 and a second cell insulating layer 132. For example, the first cell insulating layer 131 may include an oxide layer, and the second cell insulating layer 132 may include a nitride layer, but they are not limited thereto.

A wiring line spacer 150 may be disposed on the sidewalls of the wiring structure 140 and the wiring line capping layer 144. The wiring line spacer 150 may be formed on the substrate 100 and the element isolation layer 105, in a portion of the wiring structure 140 on which the bit line contact 146 is formed. The wiring line spacer 150 may extend in the second direction D2 on the sidewalls of the wiring structure 140 and the wiring line capping layer 144.

However, in the remaining portion of the wiring structure 140 on which the bit line contact 146 is not formed, the wiring line spacer 150 may be disposed on the cell insulating layer 130. The wiring line spacer 150 may extend in the second direction D2 on the sidewalls of the wiring structure 140 and the wiring line capping layer 144.

The wiring line spacer 150 may be a single layer, but as shown, the wiring line spacer 150 may be a multilayer including a first spacer 151 and a second spacer 152. For example, the first and second spacers 151 and 152 may include one of a silicon oxide layer, a silicon nitride layer, a silicon oxynitride layer (SiON), a silicon oxycarbonitride layer (SiOCN), air, and a combination thereof, but are not limited thereto.

The storage contact 120 may be formed between adjacent wiring structures 140. The storage contact 120 may overlap the substrate 100 between the adjacent wiring structures 140 and the element isolation layer 105. Here, the storage contact 120 may correspond to the buried contact BC.

The storage contact 120 may include, for example, at least one of a semiconductor material doped with impurities, a conductive silicide compound, conductive metal nitride, or metal.

A storage pad 160 may be formed on the storage contact 120. The storage pad 160 may be electrically connected to the storage contact 120. Here, the storage pad 160 may correspond to the landing pad LP.

The storage pad 160 may overlap a part of the top surface of the bit line structure 140ST. The storage pad 160 may include, for example, at least one of a semiconductor material doped with impurities, a conductive silicide compound, conductive metal nitride, or metal.

A pad separation insulating layer 180 may be formed on the storage pad 160 and the bit line structure 140ST. For example, the pad separation insulating layer 180 may be disposed on the wiring line capping layer 144.

The pad separation insulating layer 180 may define an area of the storage pad 160 forming a plurality of isolated areas. In addition, the pad separation insulating layer 180 may be patterned so as to expose a part of the top surface of the storage pad 160.

The pad separation insulating layer 180 may include an insulating material to electrically separate the plurality of storage pads 160 from each other. For example, the pad separation insulating layer 180 may include one of a silicon oxide layer, a silicon nitride layer, a silicon oxynitride layer, and a combination thereof, but is not limited thereto.

The information storage unit 190 may be formed on the pad separation insulating layer 180. The information storage unit 190 may be electrically connected to the storage pad 160. That is, the information storage unit 190 may be electrically connected to the storage contact 120.

The information storage unit 190 may include, for example, a capacitor, but is not limited thereto. The information storage unit 190 includes the lower electrode 191, a capacitor insulating layer 192, and an upper electrode 193.

The lower electrode 191 may be disposed on the storage pad 160. The lower electrode 191 is illustrated to have a pillar shape, but is not limited thereto. The lower electrode 191 may have a cylindrical shape.

The capacitor insulating layer 192 is formed on the lower electrode 191. The capacitor insulating layer 192 may be formed along the profile of the lower electrode 191.

The upper electrode 193 is formed on the capacitor insulating layer 192. The upper electrode 193 may surround the outer wall of the lower electrode 191.

The lower electrode 191 may include, for example, a doped semiconductor material such as doped polysilicon, conductive metal nitride (e.g., titanium nitride, tantalum nitride, niobium nitride, or tungsten nitride), metal (e.g., ruthenium, iridium, titanium or tantalum), conductive metal oxide (e.g., iridium oxide or niobium oxide), or the like, but inventive concepts are not limited thereto. In the semiconductor device according to some example embodiments, the lower electrode 191 may include titanium nitride (TiN). Alternatively or additionally, in the semiconductor device according to some example embodiments, the lower electrode 191 may include niobium nitride (NbN).

The capacitor insulating layer 192 may include, for example, one selected from the group consisting of or including silicon oxide, silicon nitride, silicon oxynitride, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, lead zinc niobate and a combination thereof, but is not limited thereto. Although it is illustrated that the capacitor insulating layer 192 is a single layer, it is merely for simplicity of description and inventive concepts are not limited thereto.

In the semiconductor device according to some example embodiments, the capacitor insulating layer 192 may include a stacked structure in which zirconium oxide, aluminum oxide and zirconium oxide are sequentially stacked.

In the semiconductor device according to some example embodiments, the capacitor insulating layer 192 may include a dielectric layer including hafnium (Hf).

In the semiconductor device according to some example embodiments, the capacitor insulating layer 192 may have a stacked structure including a ferroelectric material layer and a paraelectric material layer.

The ferroelectric material layer may have ferroelectric properties. The ferroelectric material layer may have a thickness enough to have ferroelectric properties. The thickness range of the ferroelectric material layer having ferroelectric properties may vary depending on the ferroelectric material.

For example, the ferroelectric material layer may include monometal oxide. The ferroelectric material layer may include a monometal oxide layer. Here, the monometal oxide may be a binary compound composed of one metal and oxygen. The ferroelectric material layer including monometal oxide may include crystal grains having an orthorhombic crystal system.

As an example, the metal included in the monometal oxide layer may be hafnium (Hf). The monometal oxide layer may be or include a hafnium oxide (HfO) layer. Here, the hafnium oxide layer may have a chemical formula that conforms to stoichiometry, or may have a chemical formula that does not conform to stoichiometry.

As another example, the metal included in the monometal oxide layer may be one of rare earth metals belonging to lanthanides. The monometal oxide layer may be a rare earth metal oxide layer formed from a rare earth metal belonging to lanthanides. Here, the rare earth metal (belonging to lanthanides) oxide layer may have a chemical formula that conforms to stoichiometry, or may have a chemical formula that does not conform to stoichiometry.

The ferroelectric material layer may further include a dopant doped into the monometal oxide layer. The doping concentration may vary depending on the type of dopant, but the doping concentration of the dopant included in the ferroelectric material layer may be 10% or less.

As an example, when the monometal oxide layer is a hafnium oxide layer, the dopant may include at least one of gadolinium (Gd), silicon (Si), aluminum (Al), yttrium (Y), lanthanum (La), scandium (Sc), cerium (Ce), dysprosium (Dy), tantalum (Ta), strontium (Sr), or niobium (Nb). As another example, when the monometal oxide layer is a rare earth metal (belonging to lanthanides) oxide layer, the dopant may include at least one of silicon (Si), aluminum (Al), hafnium (Hf), zirconium (Zr), or niobium (Nb).

As another example, the ferroelectric material layer may not include a dopant doped into the monometal oxide layer.

When the ferroelectric material layer includes a monometal oxide layer, the ferroelectric material layer may have a thickness of, for example, 1 nm or more and 10 nm or less.

For example, the ferroelectric material layer may include bimetal oxide. The ferroelectric material layer may include a bimetal oxide layer. Here, the bimetal oxide may be a ternary compound composed of two metals and oxygen. The ferroelectric material layer including bimetal oxide may include crystal grains having an orthorhombic crystal system.

The metals included in the bimetal oxide layer may be, for example, hafnium (Hf) and zirconium (Zr). The bimetal oxide layer may be a hafnium zirconium oxide layer (HfxZr(1-x)O). In the bimetal oxide layer, x may be 0.2 or more and 0.8 or less. Here, the hafnium zirconium oxide layer (HfxZr(1-x)O) may have a chemical formula that conforms to stoichiometry, or may have a chemical formula that does not conform to stoichiometry.

As an example, the ferroelectric material layer may further include a dopant doped into the bimetal oxide layer. The dopant may include at least one of gadolinium (Gd), silicon (Si), aluminum (Al), yttrium (Y), lanthanum (La), scandium (Sc), cerium (Ce), dysprosium (Dy), tantalum (Ta), or strontium (Sr). As another example, the ferroelectric material layer may not include a dopant doped into the bimetal oxide layer.

When the ferroelectric material layer includes a bimetal oxide layer, the ferroelectric material layer may have a thickness of, for example, 1 nm or more and 20 nm or less.

For example, the paraelectric material layer may be a dielectric layer including zirconium (Zr) or a stack layer including zirconium (Zr), but is not limited thereto. Although it has the same chemical formula, it may exhibit ferroelectric properties or exhibit paraelectric properties depending on the crystal structure of the dielectric material.

The paraelectric material may have a positive dielectric constant, and the ferroelectric material may have a negative dielectric constant within a specific (or, alternatively, pre-determined) range. For example, the paraelectric material may have a positive capacitance, and the ferroelectric material may have a negative capacitance.

Generally, when two or more capacitors having a positive capacitance are connected in series, the sum of the capacitances decreases. However, when a negative capacitor having a negative capacitance and a positive capacitor having a positive capacitance are connected in series, the sum of the capacitances increases.

The upper electrode 193 may include, for example, a doped semiconductor material such as doped polysilicon, conductive metal nitride (e.g., titanium nitride, tantalum nitride, niobium nitride, or tungsten nitride), metal (e.g., ruthenium, iridium, titanium or tantalum), conductive metal oxide (e.g., iridium oxide or niobium oxide) or the like, but inventive concepts are not limited thereto. In the semiconductor device according to some example embodiments, the upper electrode 193 may include titanium nitride (TiN). Alternatively or additionally, in the semiconductor device according to some example embodiments, the upper electrode 193 may be or include niobium nitride (NbN).

Figure 4:
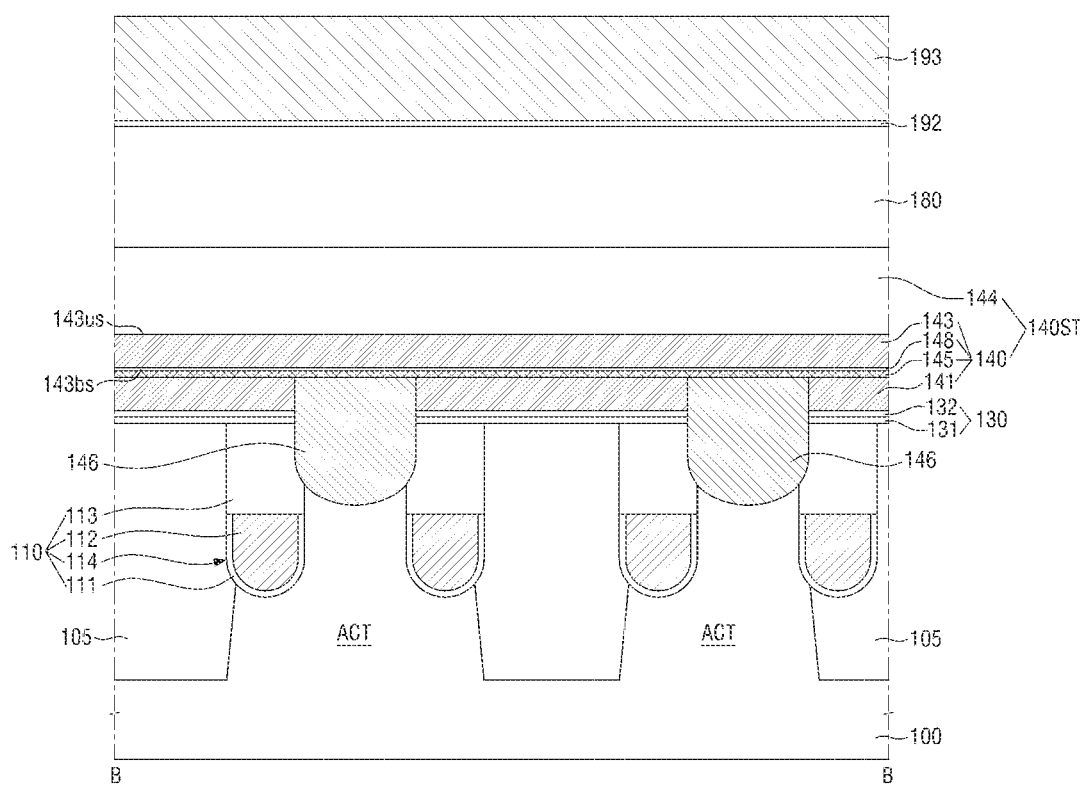
FIG. 4 is a diagram illustrating a semiconductor device according to some example embodiments.

FIG. 4 is a diagram illustrating a semiconductor device according to some example embodiments. For simplicity of description, the following description will focus on differences from the description with reference to FIGS. 1 to 3.

Referring to FIG. 4, in a semiconductor device according to some example embodiments, the wiring structure 140 may further include a third line wiring 145.

The third line wiring 145 may be disposed between the second line wiring 141 and the lower barrier layer 148. The third line wiring 145 may extend in the second direction D2 along the lower barrier layer 148.

The third line wiring 145 may be disposed on the bit line contact 146. The second line wiring 141 may extend along the third line wiring 145.

The third line wiring 145 may include or consist of, for example, a metal silicide material. For example, the third line wiring 145 may be a metal silicide line wiring.

The third line wiring 145 may include or consist of, for example, at least one of titanium (Ti) silicide, cobalt (Co) silicide, nickel (Ni) silicide, molybdenum (Mo) silicide, ruthenium (Ru) silicide, and tungsten (W) silicide, but is not limited thereto.

In the semiconductor device according to some example embodiments, the wiring structure 140 may include the second line wiring 141, the third line wiring 145, and the lower barrier layer 148, and the first line wiring 143, which are sequentially stacked on the substrate 100.

Figure 5:
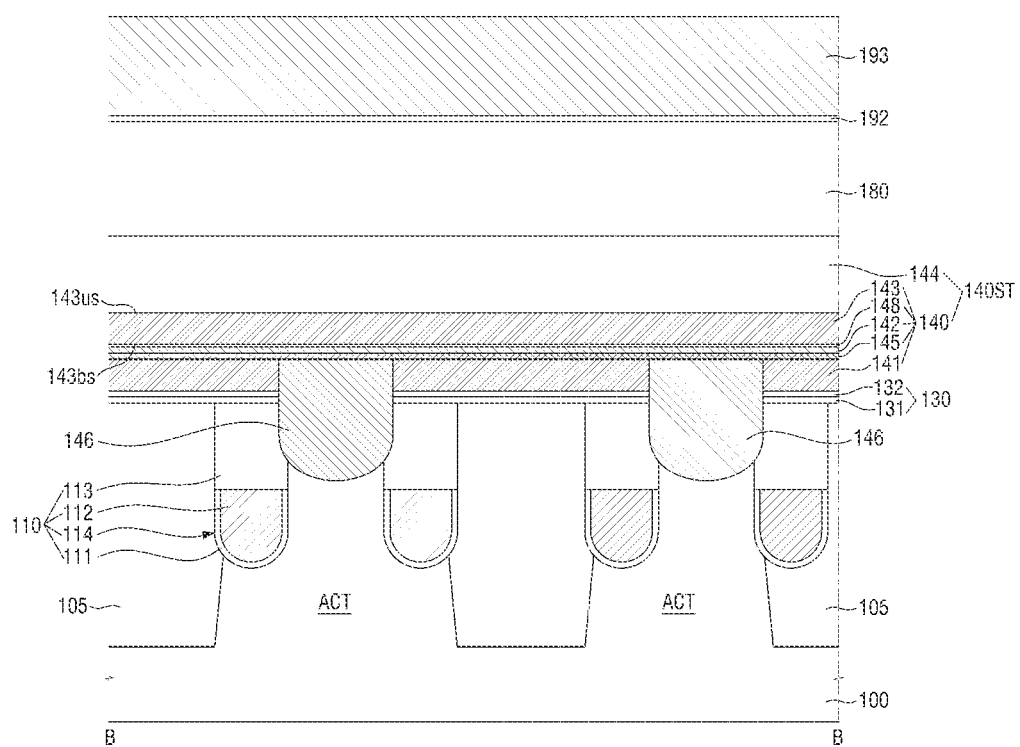
FIG. 5 is a diagram illustrating a semiconductor device according to some example embodiments.

FIG. 5 is a diagram illustrating a semiconductor device according to some example embodiments. For simplicity of description, the following description will focus on differences from the description with reference to FIG. 4.

Referring to FIG. 5, in a semiconductor device according to some example embodiments, the wiring structure 140 may further include a fourth line wiring 142.

The fourth line wiring 142 may be disposed between the third line wiring 145 and the lower barrier layer 148. The fourth line wiring 142 may extend in the second direction D2 along the lower barrier layer 148.

The fourth line wiring 142 may include or consist of, for example, a conductive material including a metal. The fourth line wiring 142 may include, for example, at least one of tantalum (Ta), tantalum nitride (TaN), tantalum silicon nitride (TaSiN), titanium (Ti), titanium nitride (TiN), titanium silicon nitride (TiSiN), tungsten (W), tungsten nitride (WN), or tungsten silicon nitride (WSiN), but is not limited thereto.

In the semiconductor device according to some example embodiments, the wiring structure 140 may include the second line wiring 141, the third line wiring 145, the fourth line wiring 142, the lower barrier layer 148, and the first line wiring 143, which are sequentially stacked on the substrate 100.

Figure 6:
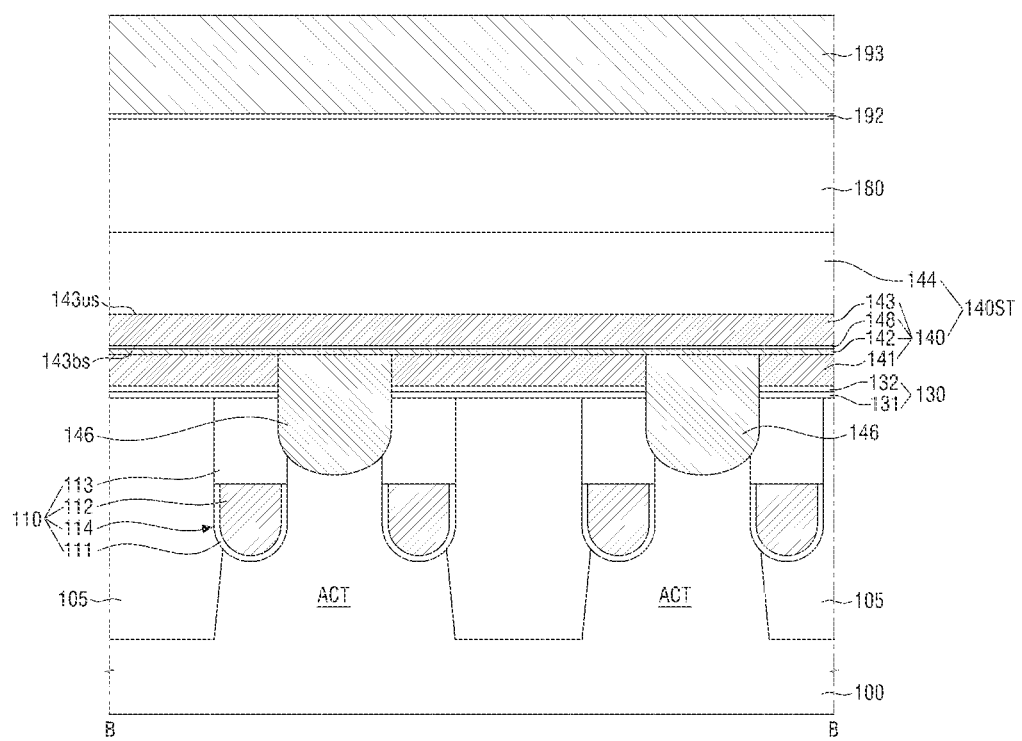
FIG. 6 is a diagram illustrating a semiconductor device according to some example embodiments.

FIG. 6 is a diagram illustrating a semiconductor device according to some example embodiments. For simplicity of description, the following description will focus on differences from the description with reference to FIGS. 1 to 3.

Referring to FIG. 6, in a semiconductor device according to some example embodiments, the wiring structure 140 may further include the fourth line wiring 142.

The fourth line wiring 142 may be disposed between the second line wiring 141 and the lower barrier layer 148. The fourth line wiring 142 may extend in the second direction D2 along the lower barrier layer 148.

The fourth line wiring 142 may be disposed on the bit line contact 146. The second line wiring 141 may extend along the fourth line wiring 142.

In the semiconductor device according to some example embodiments, the wiring structure 140 may include the second line wiring 141, the fourth line wiring 142, the lower barrier layer 148, and the first line wiring 143, which are sequentially stacked on the substrate 100.

Figure 7:
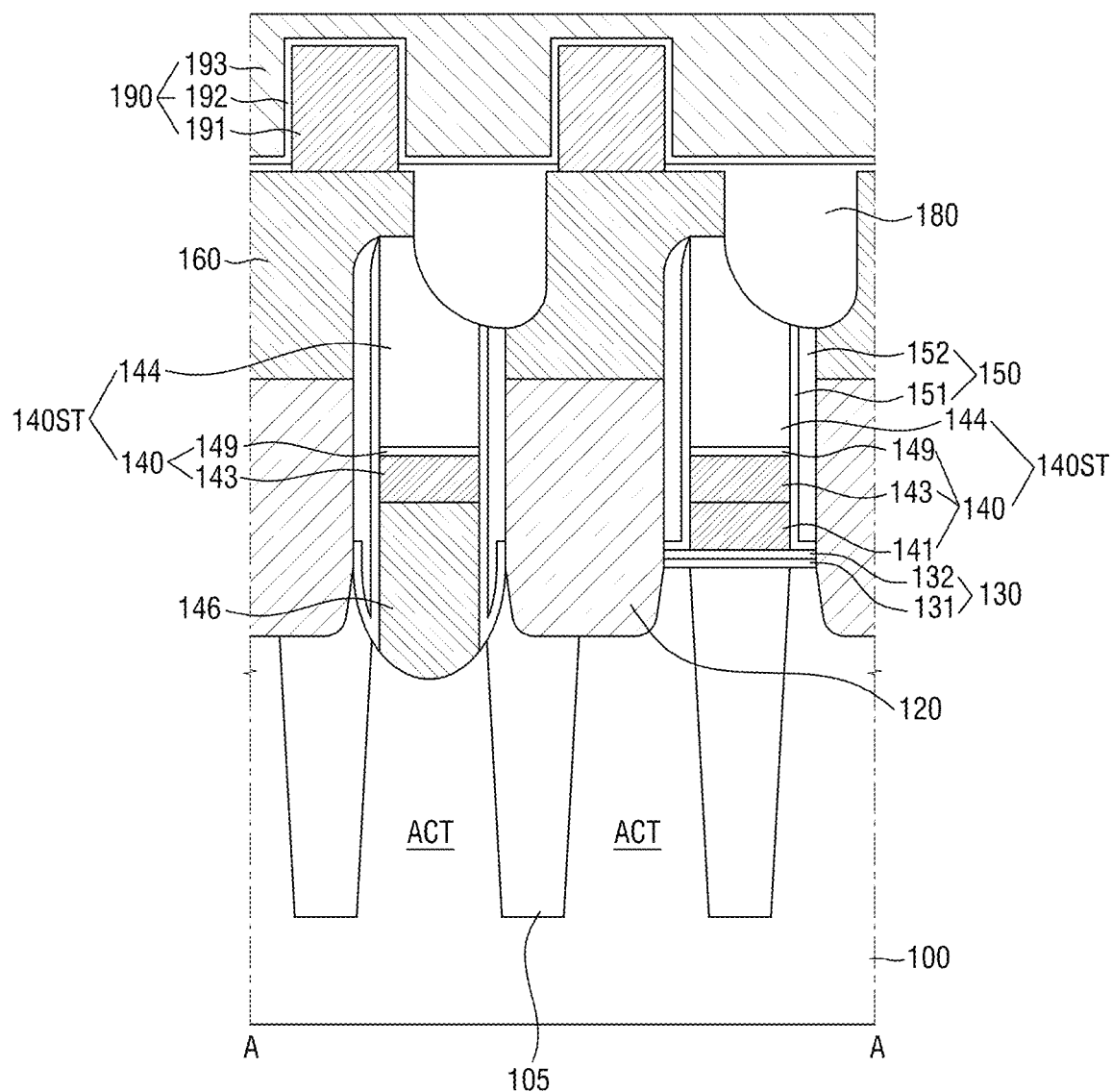
FIGS. 7 and 8 are diagrams illustrating a semiconductor device according to some example embodiments.
Figure 8:
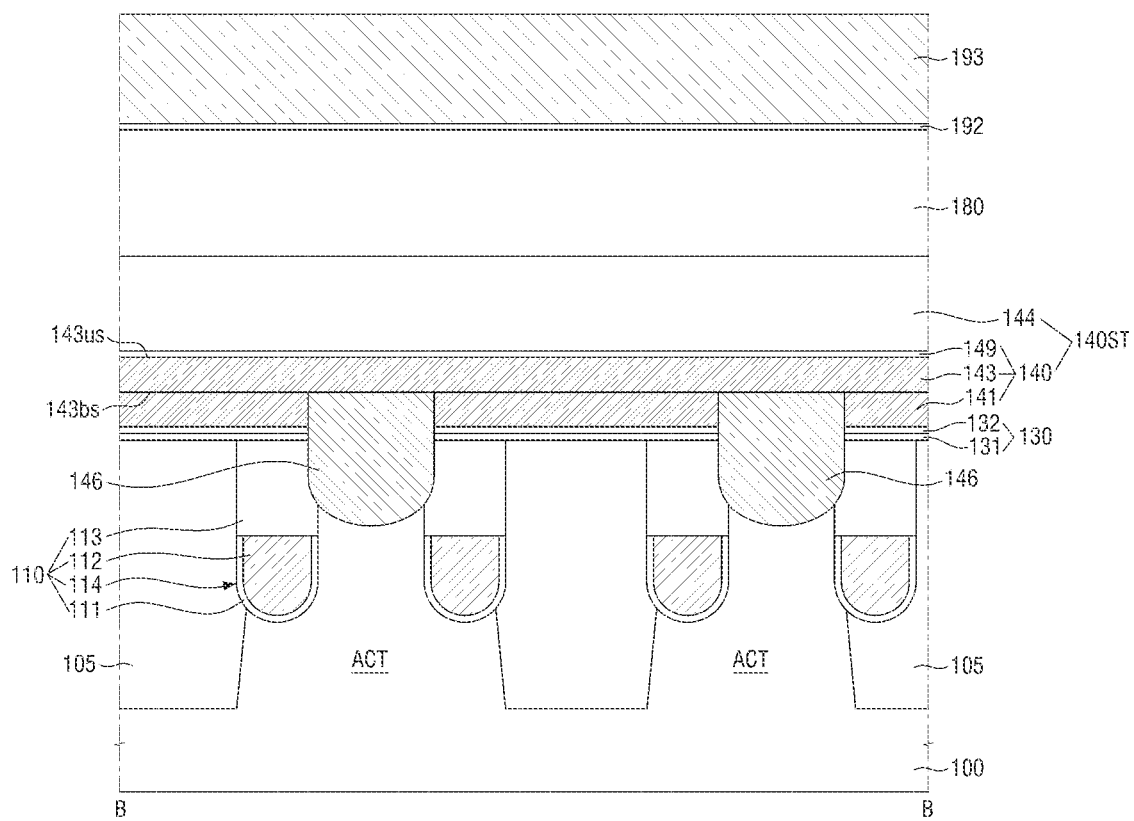

FIGS. 7 and 8 are diagrams illustrating a semiconductor device according to some example embodiments. For simplicity of description, the following description will focus on differences from the description with reference to FIGS. 1 to 3. FIG. 7 is a cross-sectional view taken along line A-A of FIG. 1. FIG. 8 is a cross-sectional view taken along line B-B of FIG. 1.

Referring to FIGS. 7 and 8, in a semiconductor device according to some example embodiments, the wiring structure 140 may include the first line wiring 143, the second line wiring 141, and an upper barrier layer 149. The wiring structure 140 does not include the lower barrier layer 148 (see FIGS. 2 and 3).

The upper barrier layer 149 may be disposed between the first line wiring 143 and the wiring line capping layer 144. The upper barrier layer 149 may extend along the top surface 143us of the first line wiring. The upper barrier layer 149 may contact the first line wiring 143. The wiring line capping layer 144 may extend along the upper barrier layer 149.

The upper barrier layer 149 may include, for example, at least one of graphene or magnesium oxide (MgO). In the semiconductor device according to some example embodiments, the upper barrier layer 149 may be or include graphene. For example, the upper barrier layer 149 may be an upper graphene layer, and may have a thickness the same as, or different from, that of a lower barrier layer 148.

When a pre-wiring line capping layer 144p (see FIG. 24) is deposited above a first pre-conductive layer 143p (see FIG. 24), the upper barrier layer 149 may protect the first line wiring 143. Alternatively or additionally, in a case where the upper barrier layer 149 is an upper graphene layer, when electrons moving within the first line wiring 143 collide with the top surface 143us of the first line wiring, the upper barrier layer 149 may allow the electrons to be reflected, e.g. may be reflected in a specular manner, from the top surface 143us of the first line wiring.

Furthermore, in a case where the upper barrier layer 149 is an upper graphene layer, during a manufacturing/fabrication process, materials included in the second to fourth line wirings 141, 145, and 142 (see FIGS. 9 to 11) disposed between the first line wiring 143 and the substrate 100 may be prevented or reduced in likelihood from being diffused to the top surface 143us of the first line wiring.

In the semiconductor device according to some example embodiments, the wiring structure 140 may include the second line wiring 141, the first line wiring 143, and the upper barrier layer 149, which are sequentially stacked on the substrate 100.

Figure 9:
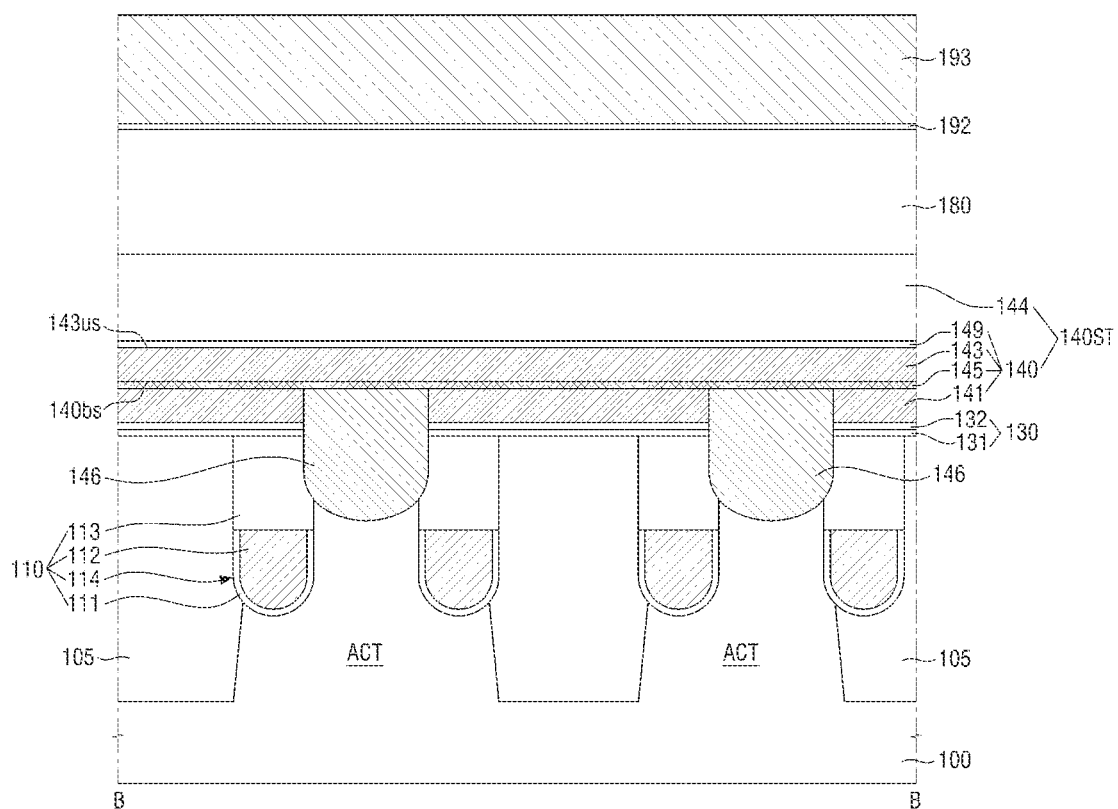
FIG. 9 is a diagram illustrating a semiconductor device according to some example embodiments.
Figure 10:
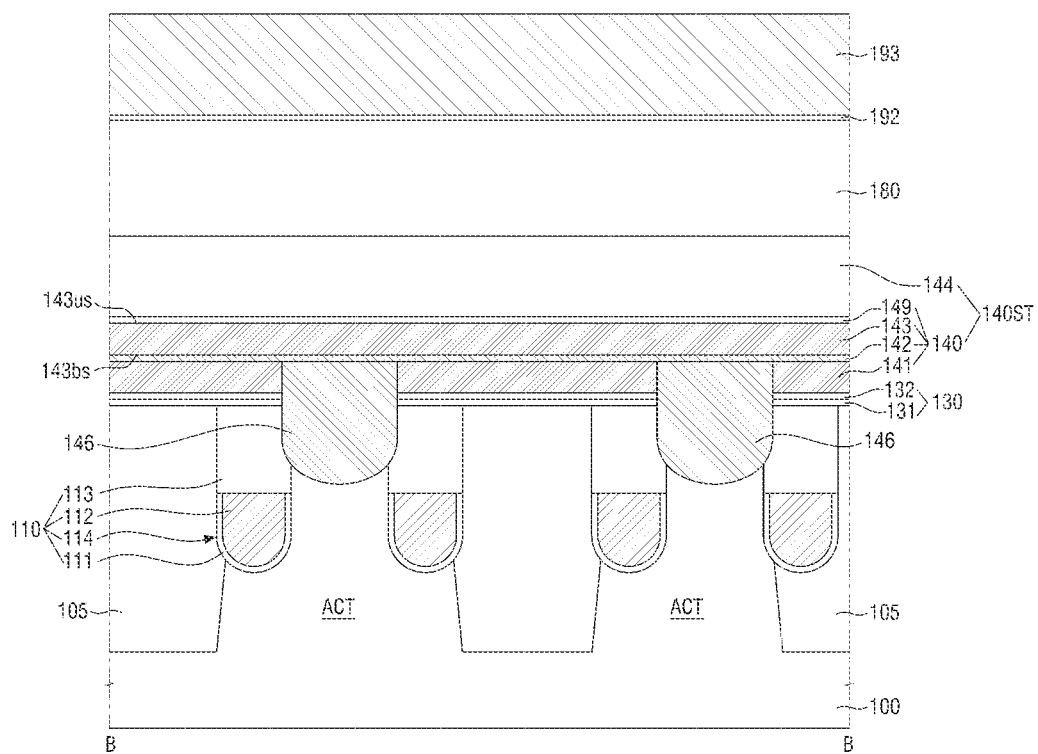
FIG. 10 is a diagram illustrating a semiconductor device according to some example embodiments.

FIG. 9 is a diagram illustrating a semiconductor device according to some example embodiments. FIG. 10 is a diagram illustrating a semiconductor device according to some example embodiments. For simplicity of description, the following description will focus on differences from the description with reference to FIGS. 7 and 8.

Referring to FIG. 9, in a semiconductor device according to some example embodiments, the wiring structure 140 may further include the third line wiring 145 provided between the first line wiring 143 and the second line wiring 141.

The third line wiring 145 may extend in the second direction D2 along the bottom surface 143bs of the first line wiring. The third line wiring 145 may be disposed on the bit line contact 146. The second line wiring 141 may extend along the third line wiring 145.

The third line wiring 145 may include or consist of, for example, a metal silicide material. For example, the third line wiring 145 may be a metal silicide line wiring.

In the semiconductor device according to some example embodiments, the wiring structure 140 may include the second line wiring 141, the third line wiring 145, the first line wiring 143, and the upper barrier layer 149, which are sequentially stacked on the substrate 100.

Referring to FIG. 10, in a semiconductor device according to some example embodiments, the wiring structure 140 may further include the fourth line wiring 142 provided between the first line wiring 143 and the second line wiring 141.

The fourth line wiring 142 may extend in the second direction D2 along the bottom surface 143bs of the first line wiring. The fourth line wiring 142 may be disposed on the bit line contact 146. The second line wiring 141 may extend along the fourth line wiring 142.

The fourth line wiring 142 may include or consist of, for example, a conductive material including a metal.

In the semiconductor device according to some example embodiments, the wiring structure 140 may include the second line wiring 141, the fourth line wiring 142, the first line wiring 143, and the upper barrier layer 149, which are sequentially stacked on the substrate 100.

Figure 11:
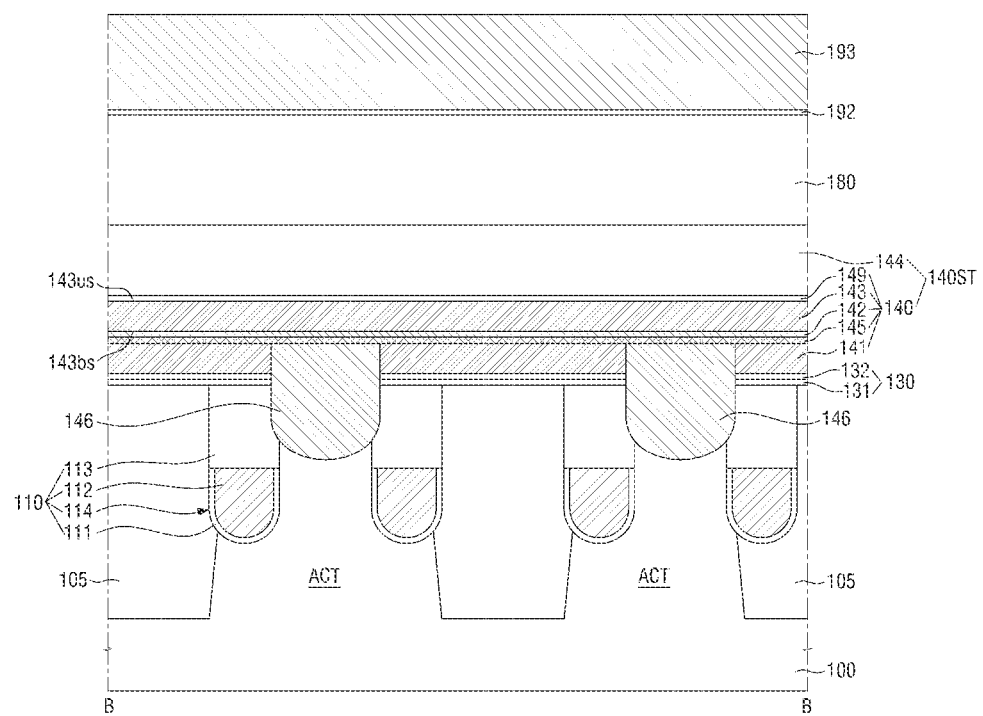
FIG. 11 is a diagram illustrating a semiconductor device according to some example embodiments.

FIG. 11 is a diagram illustrating a semiconductor device according to some example embodiments. For simplicity of description, the following description will focus on differences from the description with reference to FIG. 10.

Referring to FIG. 11, in a semiconductor device according to some example embodiments, the wiring structure 140 may further include the third line wiring 145 provided between the second line wiring 141 and the fourth line wiring 142.

The third line wiring 145 may be disposed between the fourth line wiring 142 and the second line wiring 141, and between the fourth line wiring 142 and the bit line contact 146. The third line wiring 145 may extend in the second direction D2 along the fourth line wiring 142.

In the semiconductor device according to some example embodiments, the wiring structure 140 may include the second line wiring 141, the third line wiring 145, the fourth line wiring 142, the first line wiring 143 and the upper barrier layer 149, which are sequentially stacked on the substrate 100.

Figure 12:
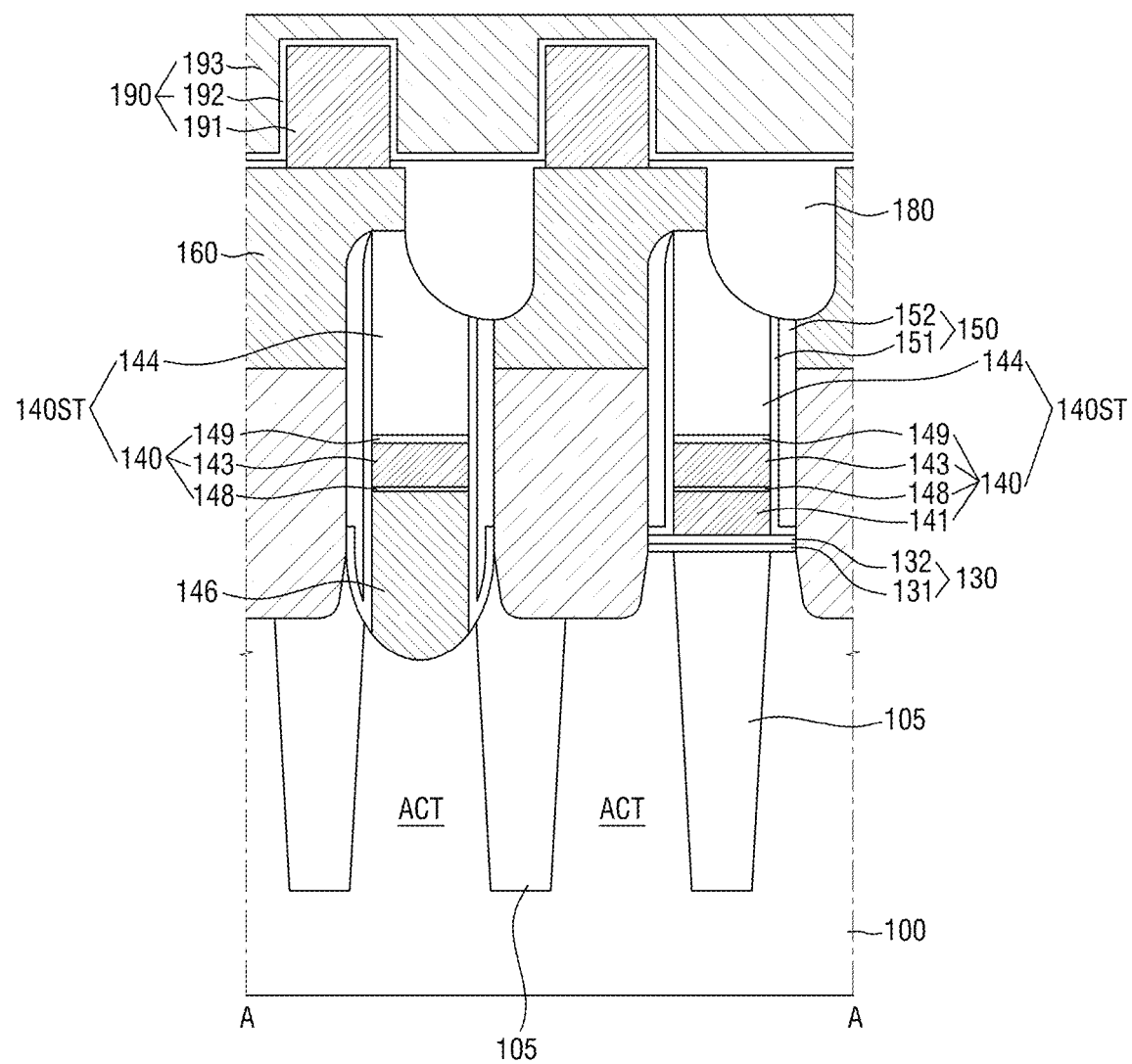
FIGS. 12 and 13 are diagrams illustrating a semiconductor device according to some example embodiments.
Figure 13:
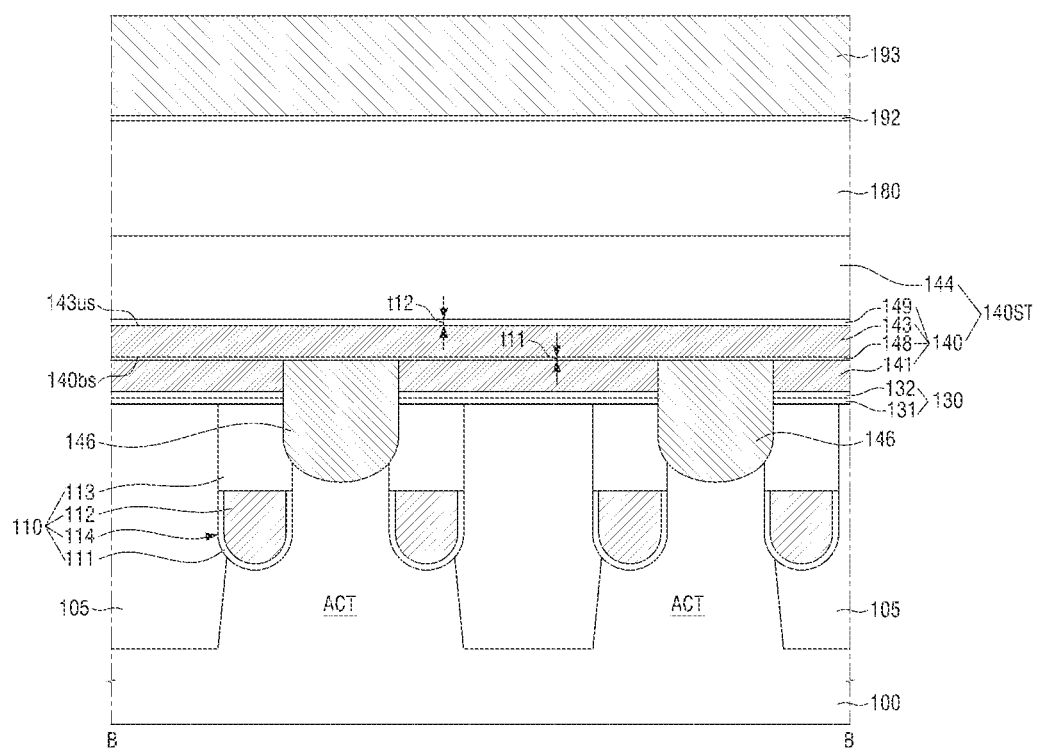

FIGS. 12 and 13 are diagrams illustrating a semiconductor device according to some example embodiments. For simplicity of description, the following description will focus on differences from the description with reference to FIGS. 1 to 3. FIG. 12 is a cross-sectional view taken along line A-A of FIG. 1. FIG. 13 is a cross-sectional view taken along line B-B of FIG. 1.

Referring to FIGS. 12 and 13, in a semiconductor device according to some example embodiments, the wiring structure 140 may further include the upper barrier layer 149.

The upper barrier layer 149 may be disposed on the top surface 143$us$ of the first line wiring. The upper barrier layer 149 may extend along the top surface 143$us$ of the first line wiring. The upper barrier layer 149 may contact the first line wiring 143.

The wiring line capping layer 144 may be disposed on the upper barrier layer 149. The wiring line capping layer 144 may extend along the upper barrier layer 149.

The wiring structure 140 may include the lower barrier layer 148 and the upper barrier layer 149 which are in contact with the first line wiring 143. In a case where the lower barrier layer 148 and the upper barrier layer 149 are or include graphene layers, the wiring structure 140 may include an upper graphene layer extending along the top surface 143$us$ of the first line wiring, and a lower graphene layer extending along the bottom surface 143$bs$ of the first line wiring.

For example, a thickness t11 of the lower barrier layer 148 may be greater than a thickness t12 of the upper barrier layer 149. The thickness t11 and the thickness t12 may correspond to a number of layers of graphene, which may be an integer greater than or equal to one.

In the semiconductor device according to some example embodiments, the wiring structure 140 may include the second line wiring 141, the lower barrier layer 148, and the first line wiring 143, and the upper barrier layer 149, which are sequentially stacked on the substrate 100.

Although not shown, as an example, the wiring structure 140 may further include the third line wiring 145 (see FIG. 4) provided between the lower barrier layer 148 and the second line wiring 141. For example, the wiring structure 140 may further include the fourth line wiring 142 (see FIG. 6) provided between the lower barrier layer 148 and the second line wiring 141. As another example, the wiring structure 140 may further include the third line wiring 145 (see FIG. 5) and the fourth line wiring 142 (see FIG. 5) which are provided between the lower barrier layer 148 and the second line wiring 141.

Figure 14:
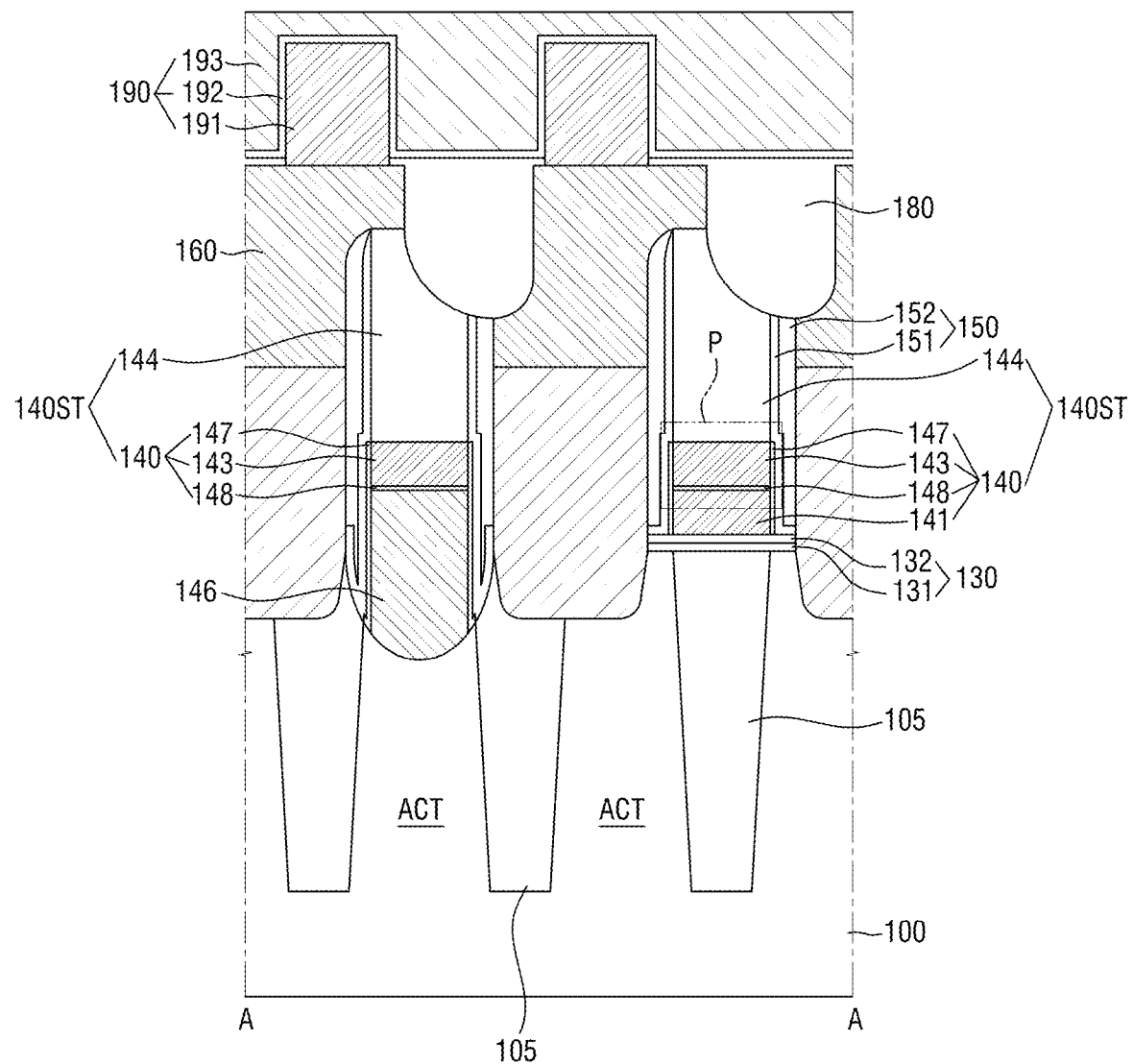
FIG. 14 is a diagram illustrating a semiconductor device according to some example embodiments.
Figure 15:
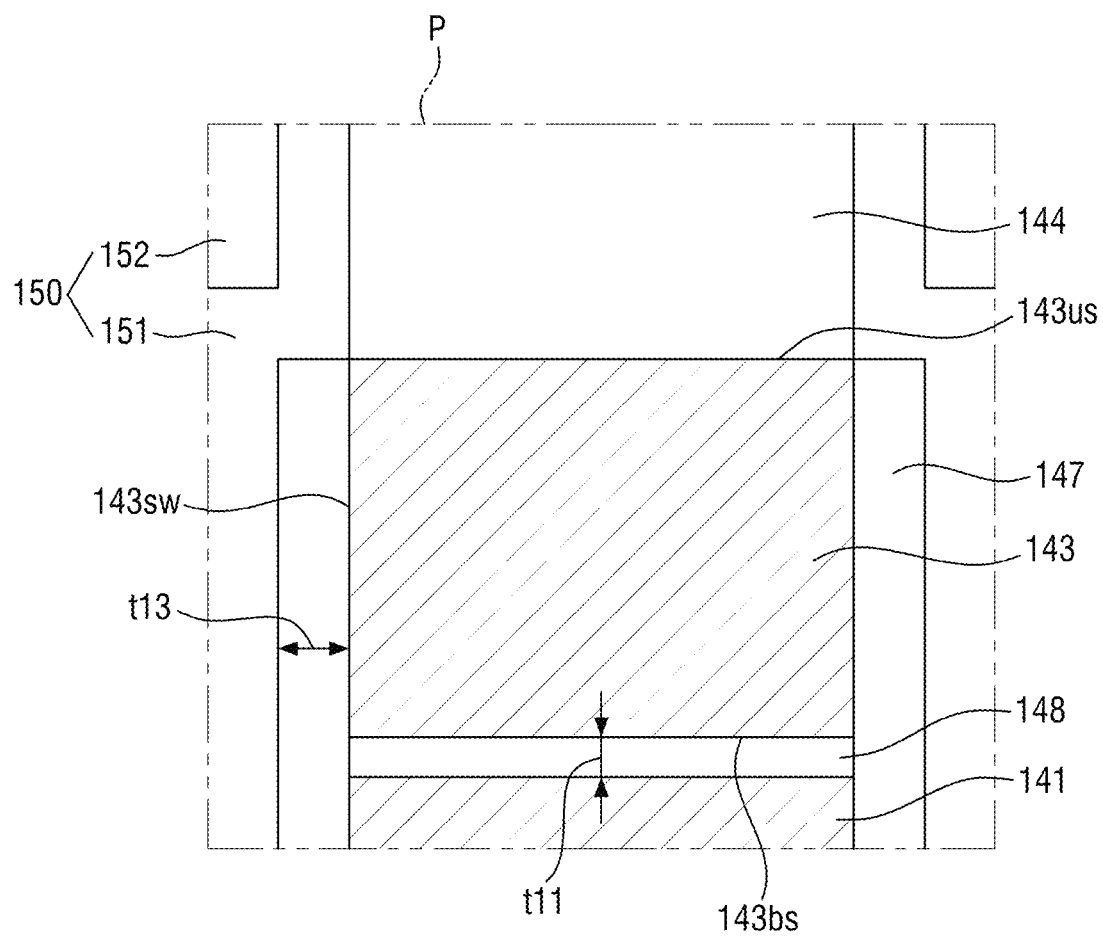
FIG. 15 is an enlarged view of portion P of FIG. 14.

FIG. 14 is a diagram illustrating a semiconductor device according to some example embodiments. FIG. 15 is an enlarged view of portion P of FIG. 14. For simplicity of description, the following description will focus on differences from the description with reference to FIGS. 1 to 3.

Referring to FIGS. 14 and 15, in a semiconductor device according to some example embodiments, the wiring structure 140 may further include a sidewall barrier layer 147 extending along a sidewall 143$sw$ of the first line wiring, the sidewall of the lower barrier layer 148, and the sidewall of the second line wiring 141.

The wiring line spacer 150 covers the sidewall barrier layer 147. In a region where the wiring structure 140 and the substrate 100 are electrically connected, the sidewall barrier layer 147 may be disposed on the sidewall of the bit line contact 146. When a part of the substrate 100 is exposed during a process of forming the bit line contact 146, the sidewall barrier layer 147 may be formed even on the exposed substrate 100.

The sidewall barrier layer 147 may contact the first line wiring 143. For example, the sidewall barrier layer 147 may contact the second line wiring 141 and the lower barrier layer 148.

The sidewall barrier layer 147 may include, for example, at least one of graphene or magnesium oxide (MgO). In the semiconductor device according to some example embodiments, the sidewall barrier layer 147 may be or include graphene. For example, the sidewall barrier layer 147 may be a sidewall graphene layer.

In a case where the sidewall barrier layer 147 is a sidewall graphene layer, when electrons moving within the first line wiring 143 collide with the sidewall 143$sw$ of the first line wiring, the sidewall barrier layer 147 may allow the electrons to be reflected in a specular manner from the sidewall 143$sw$ of the first line wiring.

For example, the thickness t11 of the lower barrier layer 148 may be less than or equal to a thickness t13 of the sidewall barrier layer 147.

Although not shown, as an example, when the wiring structure 140 further includes the third line wiring 145 (see FIG. 4) between the lower barrier layer 148 and the second line wiring 141, the sidewall barrier layer 147 may be formed on the sidewall of the third line wiring 145. Alternatively or additionally, when the wiring structure 140 further includes the fourth line wiring 142 (see FIG. 6) between the lower barrier layer 148 and the second line wiring 141, the sidewall barrier layer 147 may be formed on the sidewall of the fourth line wiring 142. Alternatively or additionally, when the wiring structure 140 further includes the third line wiring 145 (see FIG. 5) and the fourth line wiring 142 (see FIG. 5) between the lower barrier layer 148 and the second line wiring 141, the sidewall barrier layer 147 may be formed on the sidewall of the third line wiring 145 and the sidewall of the fourth line wiring 142.

Figure 16:
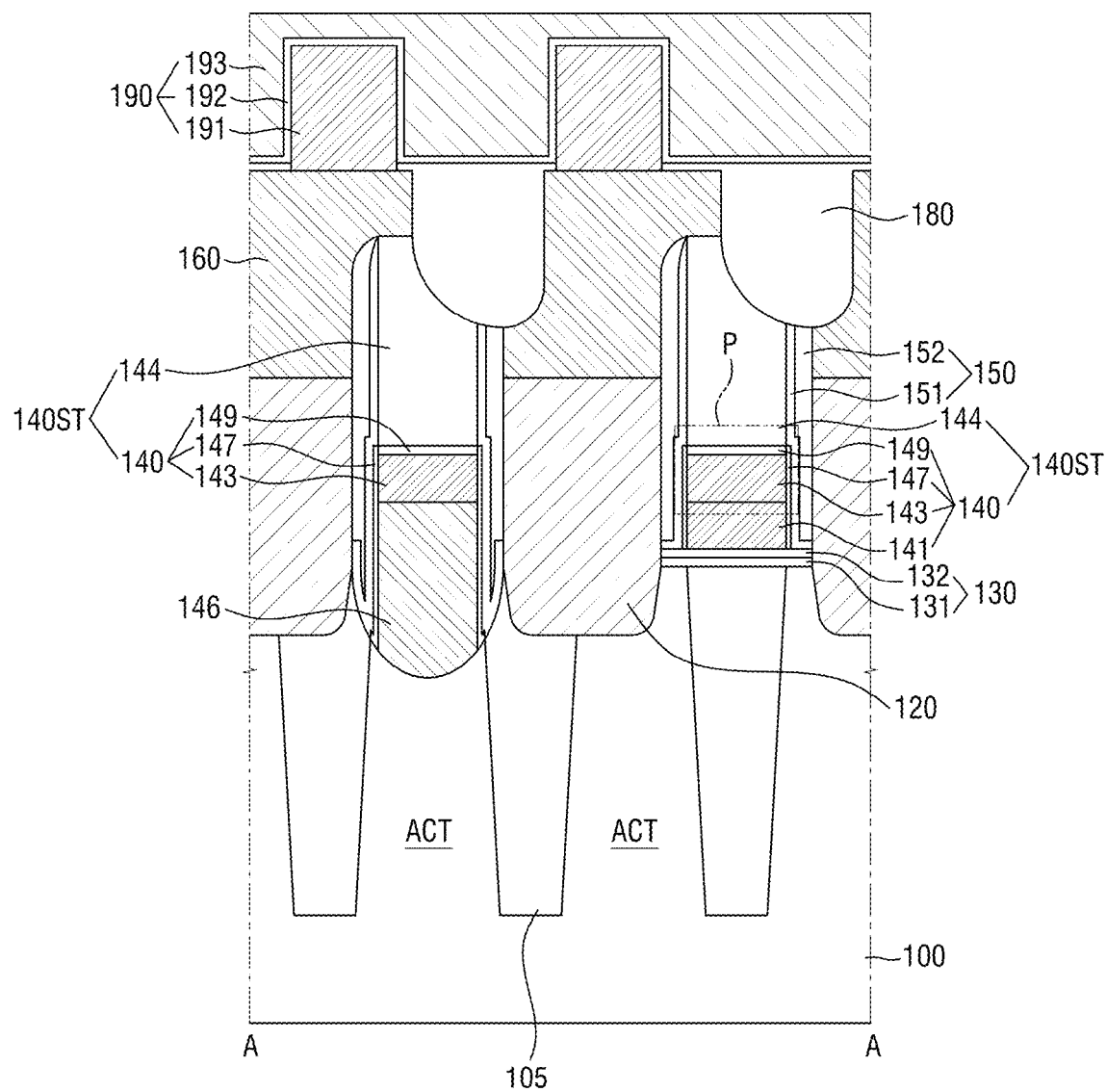
FIG. 16 is a diagram illustrating a semiconductor device according to some example embodiments.
Figure 17:
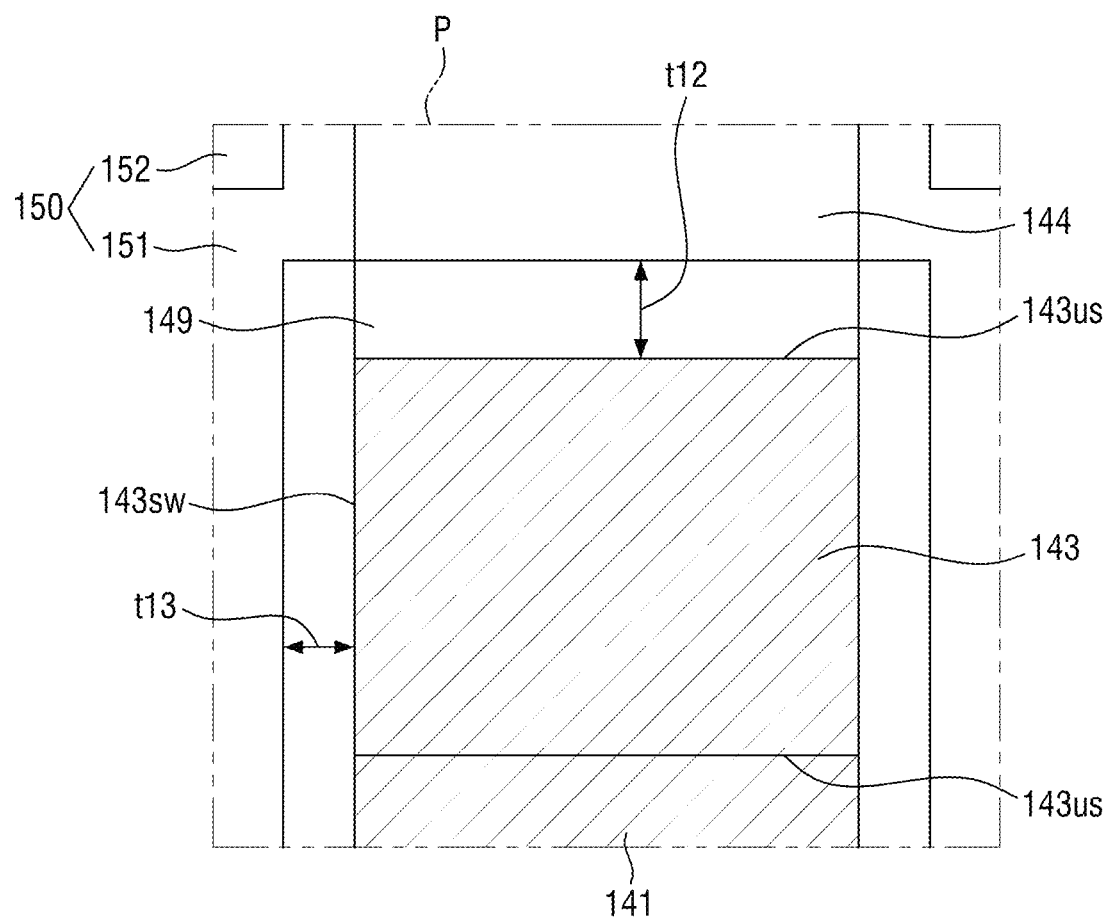
FIG. 17 is an enlarged view of portion P of FIG. 16.

FIG. 16 is a diagram illustrating a semiconductor device according to some example embodiments. FIG. 17 is an enlarged view of portion P of FIG. 16. For simplicity of description, the following description will focus on differences from the description with reference to FIGS. 7 and 8.

For reference, since a description of the sidewall barrier layer 147 is similar to that described with reference to FIGS. 14 and 15, the difference will be mainly described.

Referring to FIGS. 16 and 17, in a semiconductor device according to some example embodiments, the wiring structure 140 may further include the sidewall barrier layer 147 extending along the sidewall of the upper barrier layer 149, the sidewall 143sw of the first line wiring, and the sidewall of the second line wiring 141.

For example, the sidewall barrier layer 147 may contact the first line wiring 143, the second line wiring 141, and the upper barrier layer 149.

For example, the thickness t12 of the upper barrier layer 149 may be greater than or equal to the thickness t13 of the sidewall barrier layer 147.

Although not shown, as an example, when the wiring structure 140 further includes the third line wiring 145 (see FIG. 9) between the first line wiring 143 and the second line wiring 141, the sidewall barrier layer 147 may be formed on the sidewall of the third line wiring 145. Alternatively or additionally, when the wiring structure 140 further includes the fourth line wiring 142 (see FIG. 10) between the first line wiring 143 and the second line wiring 141, the sidewall barrier layer 147 may be formed on the sidewall of the fourth line wiring 142. Alternatively or additionally, when the wiring structure 140 further includes the third line wiring 145 (see FIG. 11) and the fourth line wiring 142 (see FIG. 11) between the first line wiring 143 and the second line wiring 141, the sidewall barrier layer 147 may be formed on the sidewall of the third line wiring 145 and the sidewall of the fourth line wiring 142.

Figure 18:
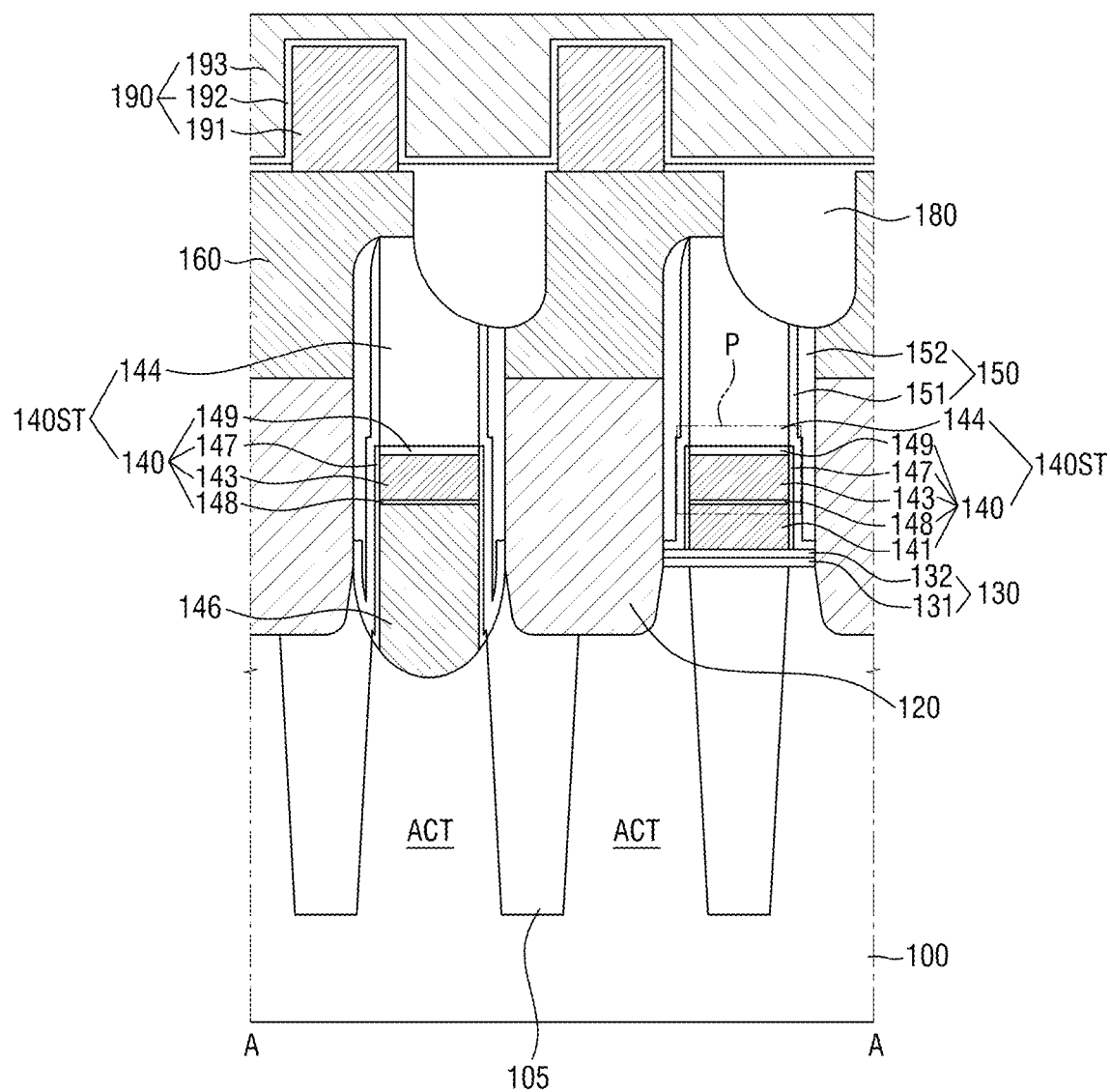
FIG. 18 is a diagram illustrating a semiconductor device according to some example embodiments.
Figure 19:
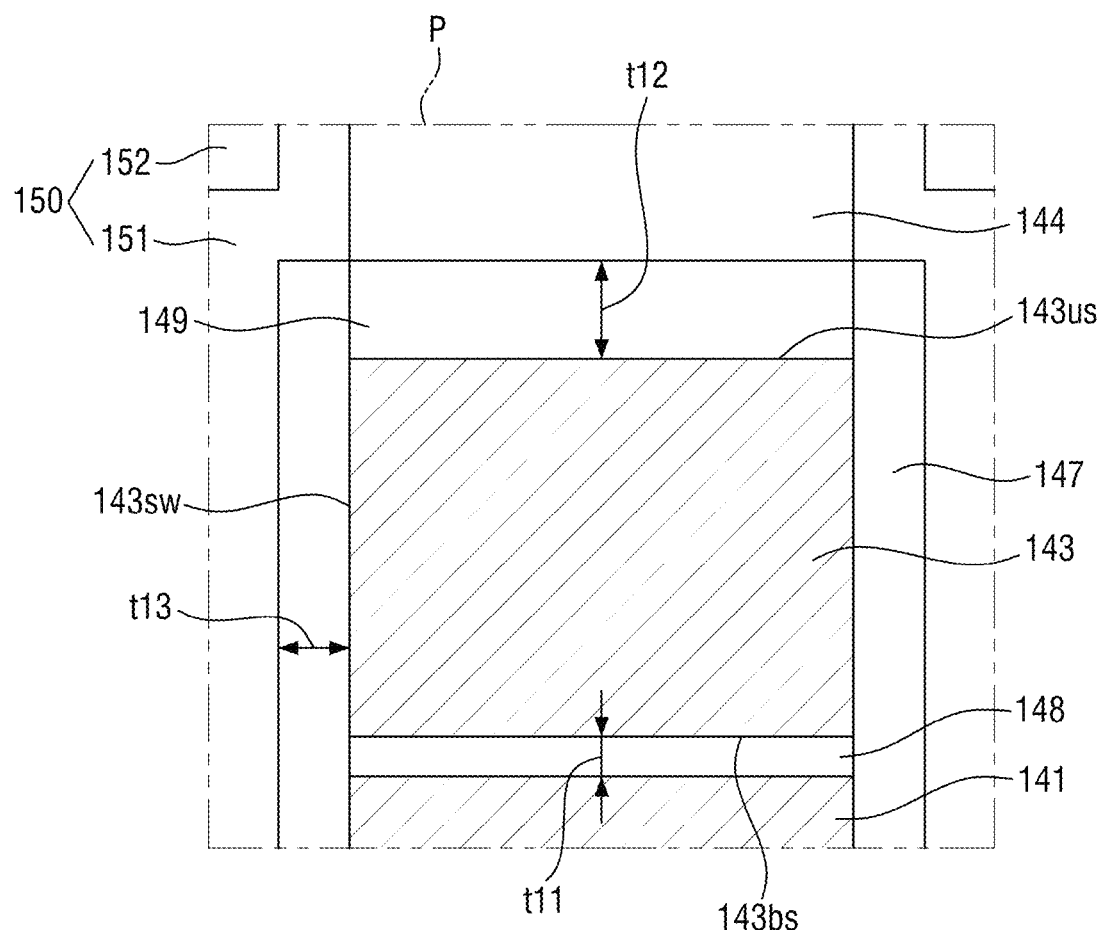
FIG. 19 is an enlarged view of portion P of FIG. 18.

FIG. 18 is a diagram illustrating a semiconductor device according to some example embodiments. FIG. 19 is an enlarged view of portion P of FIG. 18. For simplicity of description, the following description will focus on differences from the description with reference to FIGS. 12 and 13.

For reference, since a description of the sidewall barrier layer 147 is similar to the description with reference to FIGS. 14 and 15, the differences will be mainly described.

Referring to FIGS. 18 and 19, in a semiconductor device according to some example embodiments, the wiring structure 140 may further include the sidewall barrier layer 147 extending along the sidewall of the upper barrier layer 149, the sidewall 143sw of the first line wiring, the sidewall of the lower barrier layer 148, and the sidewall of the second line wiring 141.

For example, the sidewall barrier layer 147 may contact the first line wiring 143, the second line wiring 141, the lower barrier layer 148, and the upper barrier layer 149.

For example, the thickness t12 of the upper barrier layer 149 may be greater than or equal to the thickness t13 of the sidewall barrier layer 147. The thickness t11 of the lower barrier layer 148 may be smaller than or equal to the thickness t13 of the sidewall barrier layer 147. The thickness t11 of the lower barrier layer 148 may be smaller than the thickness t12 of the upper barrier layer 149.

Unlike the illustrated example, the wiring structure 140 may further include at least one of the third line wiring 145 (see FIG. 4) and/or the fourth line wiring 142 (see FIG. 6), provided between the lower barrier layer 148 and the second line wiring 141.

Figure 20:
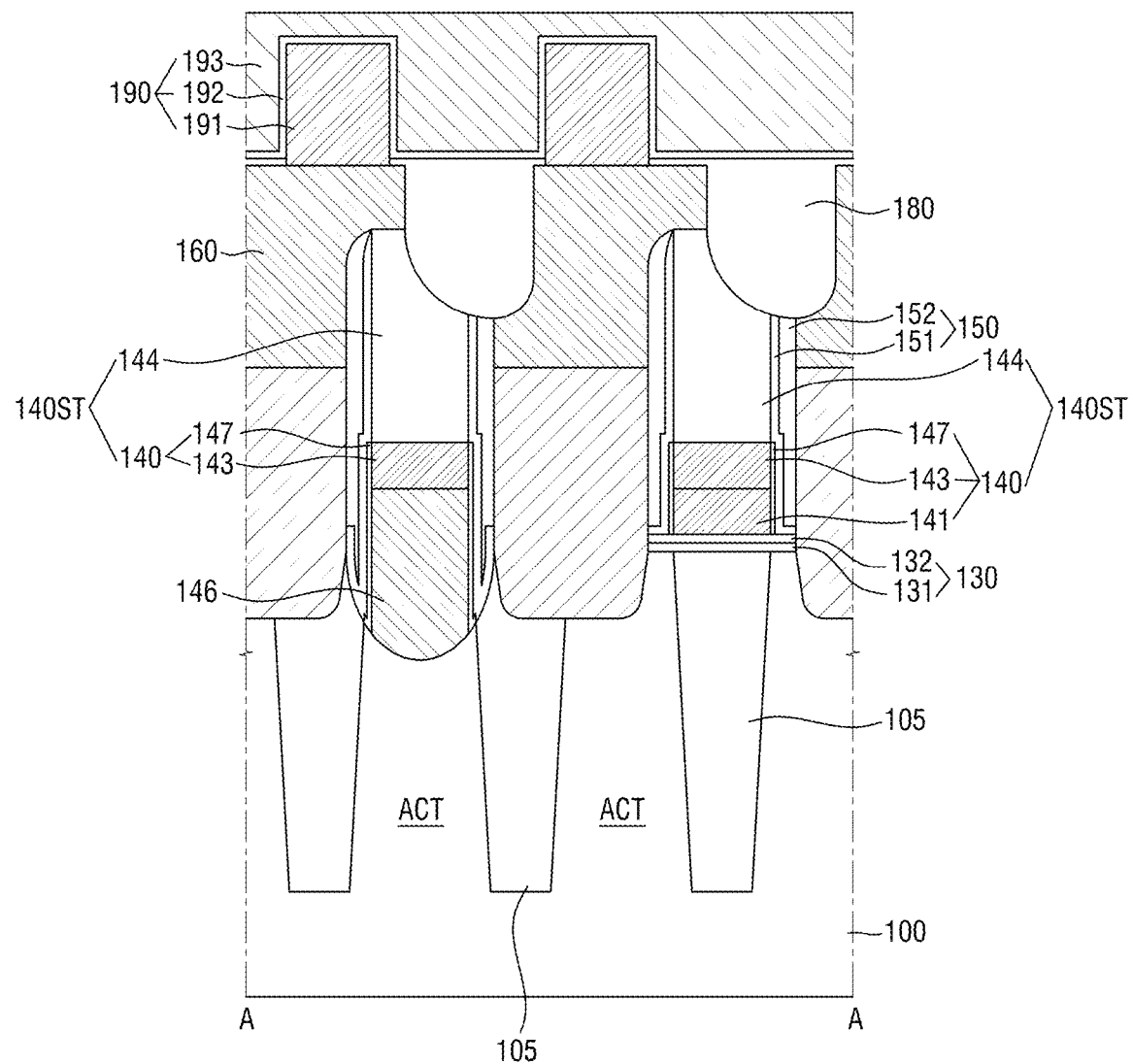
FIG. 20 is a diagram illustrating a semiconductor device according to some example embodiments.

FIG. 20 is a diagram illustrating a semiconductor device according to some example embodiments. For simplicity of description, the following description will focus on differences from the description with reference to FIGS. 1 to 3.

Referring to FIG. 20, in a semiconductor device according to some example embodiments, the wiring structure 140 may include the first line wiring 143, the second line wiring 141, and the sidewall barrier layer 147. The wiring structure 140 does not include the lower barrier layer 148 (see FIGS. 2 and 3).

The sidewall barrier layer 147 may extend along the sidewall of the first line wiring 143 and the sidewall of the second line wiring 141. The sidewall barrier layer 147 may be formed on the sidewall of the bit line contact 146.

Since a description of the sidewall barrier layer 147 is substantially the same as the description with reference to FIGS. 14 and 15, detailed description will be omitted below for brevity of description.

Unlike the illustrated example, the wiring structure 140 may further include at least one of the third line wiring 145 (see FIG. 4) and/or the fourth line wiring 142 (see FIG. 6), provided between the first line wiring 143 and the second line wiring 141.

Figure 21:
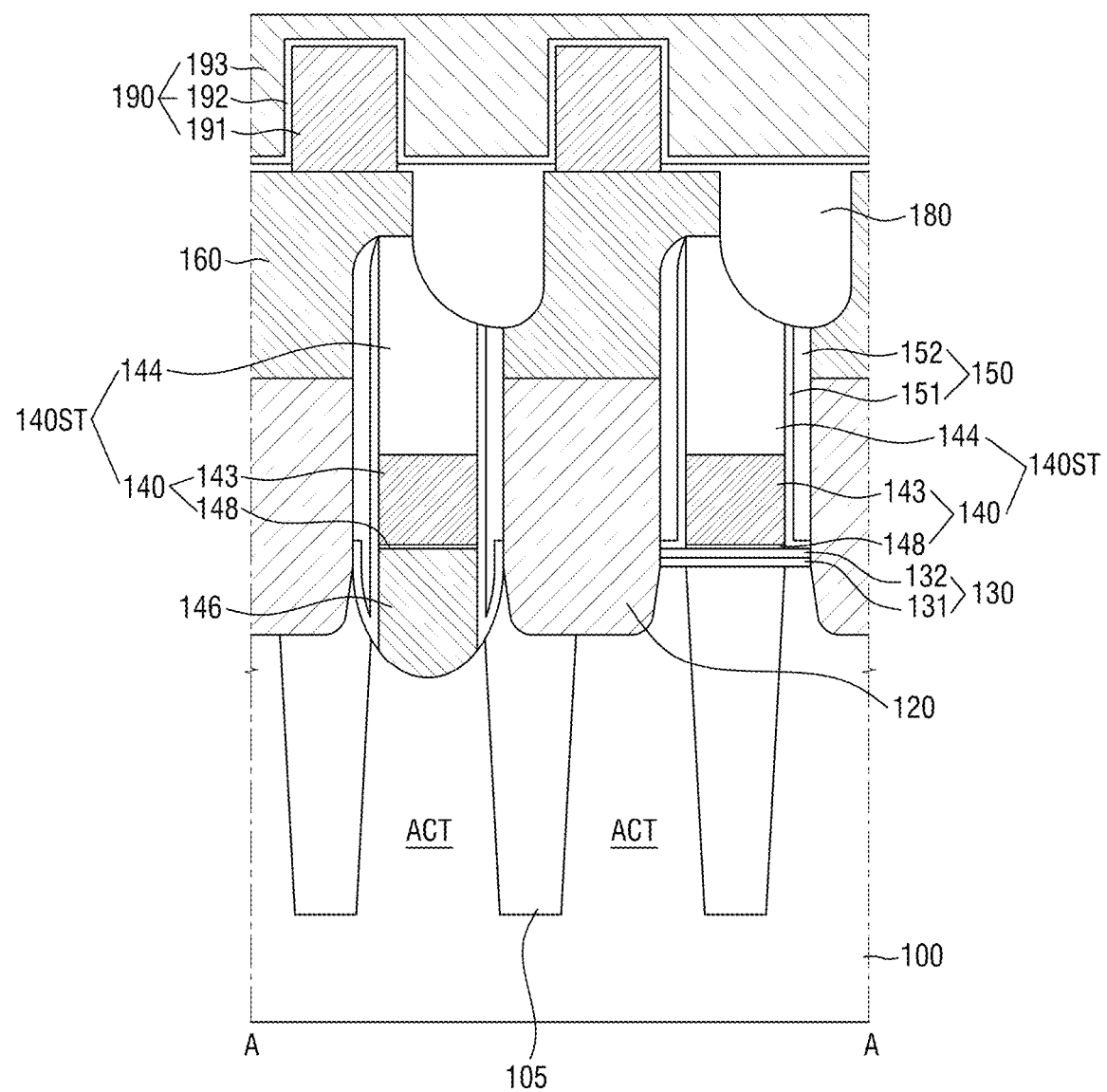
FIGS. 21 and 22 are diagrams illustrating a semiconductor device according to some example embodiments.
Figure 22:
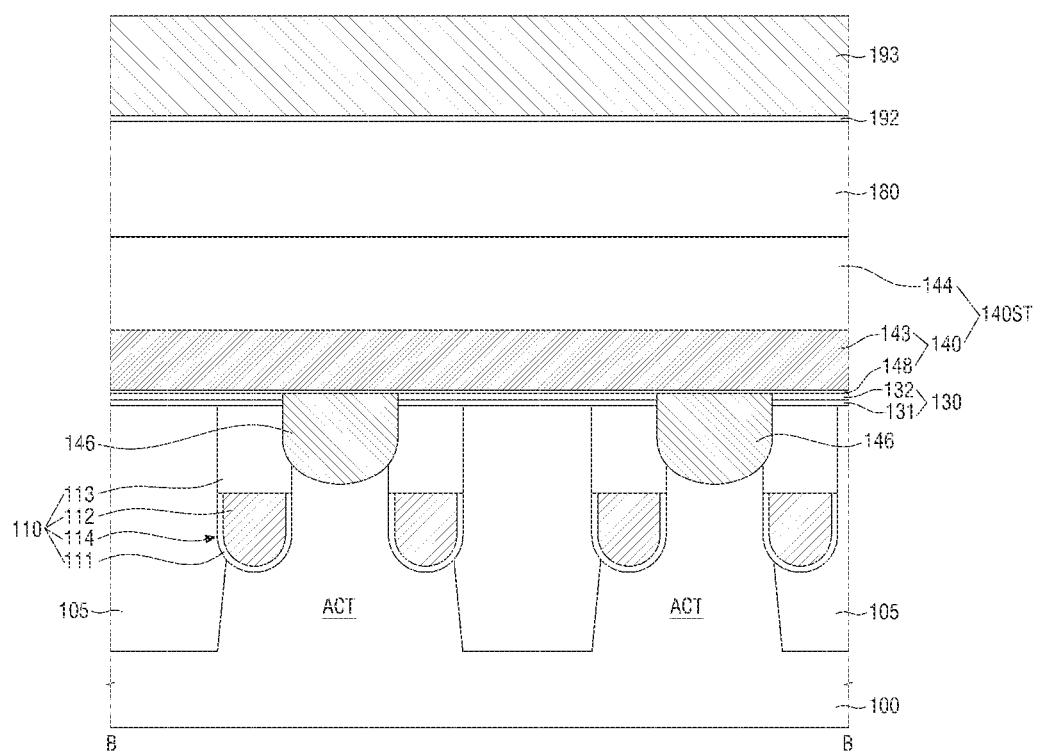

FIGS. 21 and 22 are diagrams illustrating a semiconductor device according to some example embodiments. For simplicity of description, the following description will focus on differences from the description with reference to FIGS. 1 to 3. FIG. 21 is a cross-sectional view taken along line A-A of FIG. 1. FIG. 22 is a cross-sectional view taken along line B-B of FIG. 1.

Referring to FIGS. 21 and 22, in a semiconductor device according to some example embodiments, the lower barrier layer 148 may contact the cell insulating layer 130 and the bit line contact 146.

The second line wiring 141 (see FIGS. 2 and 3) is not provided between the lower barrier layer 148 and the cell insulating layer 130.

FIGS. 23 to 27 are views illustrating the intermediate steps of a method of manufacturing a semiconductor device according to some example embodiments.

Figure 23:
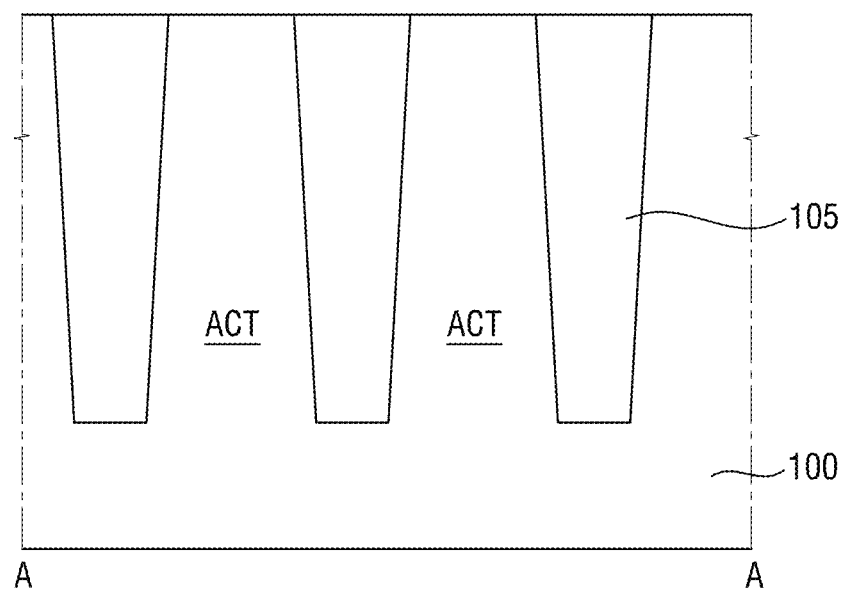
FIGS. 23 to 27 are views illustrating the intermediate steps of a method of manufacturing a semiconductor device according to some example embodiments.

Referring to FIG. 23, the element isolation layer 105 is formed in the substrate 100. The substrate 100 includes the active regions ACT defined by the element isolation layer 105.

For example, an element isolation trench may be formed in the substrate 100. The element isolation trench may be filled with an insulating material to form the element isolation layer 105 in the substrate 100.

Figure 24:
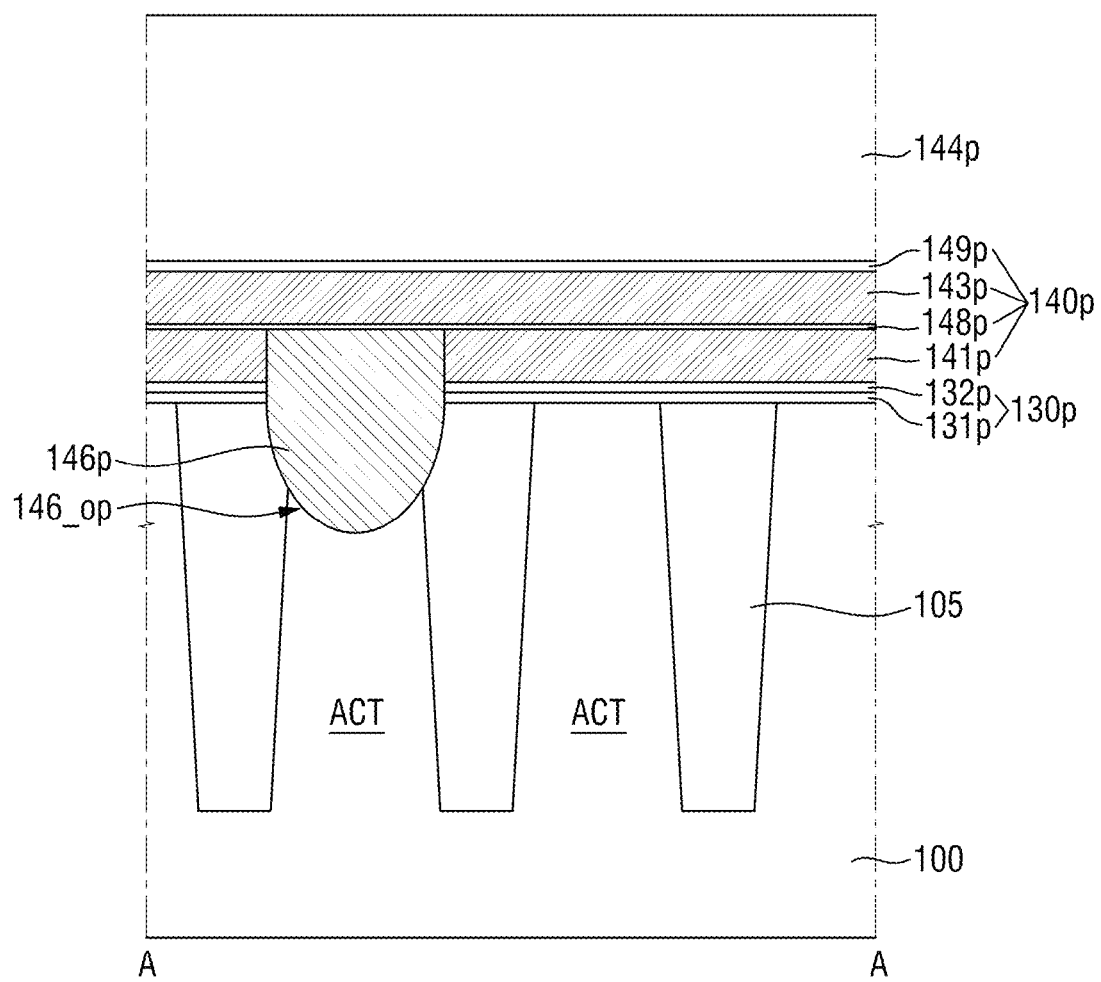

Referring to FIG. 24, a pre-cell insulating layer 130p, a pre-wiring structure 140p including a pre-bit line contact 146p connected to the substrate 100, and the pre-wiring line capping layer 144p may be sequentially formed on the substrate 100.

Specifically, the pre-cell insulating layer 130p may be formed on the substrate 100 and the element isolation layer 105. A second pre-conductive layer 141p may be formed on the pre-cell insulating layer 130p.

The pre-cell insulating layer 130p may include a first pre-cell insulating layer 131p and a second pre-cell insulating layer 132p, but example embodiments are not limited thereto.

Subsequently, after a mask pattern that simultaneously covers the ends of the active regions ACT adjacent in the first direction D1 in FIG. 1 is formed, the second pre-conductive layer 141p and the pre-cell insulating layer 130p may be removed using the mask pattern. Accordingly, a bit line contact opening 146_op may be formed. The pre-bit line contact 146p filling the bit line contact opening 146_op may be formed.

A pre-lower barrier layer 148p and a first pre-conductive layer 143p may be sequentially formed on the pre-bit line contact 146p and the second pre-conductive layer 141p. A pre-upper barrier layer 149p may be formed on the first pre-conductive layer 143p.

In this way, the pre-wiring structure 140p including the first and second pre-conductive layers 143p and 141p, the pre-lower barrier layer 148p, and the pre-upper barrier layer 149p may be formed on the pre-cell insulating layer 130p.

Subsequently, the pre-wiring line capping layer 144p may be formed on the pre-wiring structure 140p.

Figure 25:
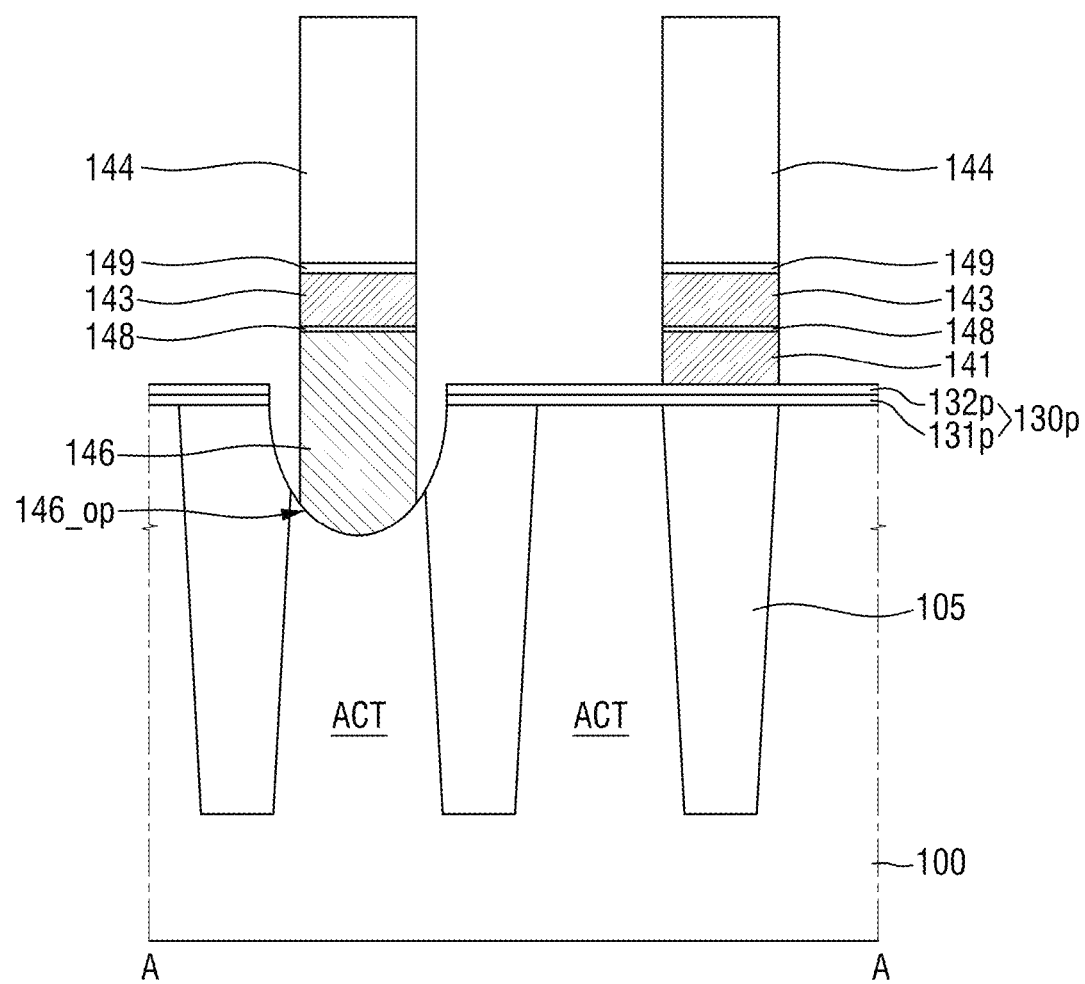

Referring to FIG. 25, the pre-wiring structure 140p and the pre-wiring line capping layer 144p are etched to from the first line wiring 143, the second line wiring 141, the lower barrier layer 148, the upper barrier layer 149, and the wiring line capping layer 144, which extend in the second direction D2 (see FIG. 1) on the substrate 100 and the pre-cell insulating layer 130p.

Further, the pre-bit line contact 146p may be patterned to form the bit line contact 146 between the lower barrier layer 148 and the substrate 100.

For example, the first line wiring 143 may be a ruthenium line wiring. After the etching process, an oxide of a metal included in the first line wiring 143 may be formed on the sidewall of the first line wiring 143. The metal oxide formed on the sidewall of the first line wiring 143 may deteriorate the characteristics of the first line wiring 143.

In order to prevent or reduce the likelihood of the deterioration of the characteristics of the first line wiring 143, after the etching process for forming the first line wiring 143, a reduction process for reducing the surface of the first line wiring 143 may be performed.

The reduction process for reducing the surface of the first line wiring 143 may be, for example, at least one of a heat treatment process using a reducing gas, a high-temperature plasma process using a reducing gas, or a radical process using a reducing gas. For example, the reducing gas may include hydrogen ($H_2$), but is not limited thereto.

As an example, the etching process for forming the first line wiring 143 and the reduction process for reducing the surface of the first line wiring 143 may be performed in-situ (e.g. within one chamber or within one tool). As another example, the etching process for forming the first line wiring 143 and the reduction process for reducing the surface of the first line wiring 143 may be performed ex-situ (e.g. with separate chambers and/or tools).

Figure 26:
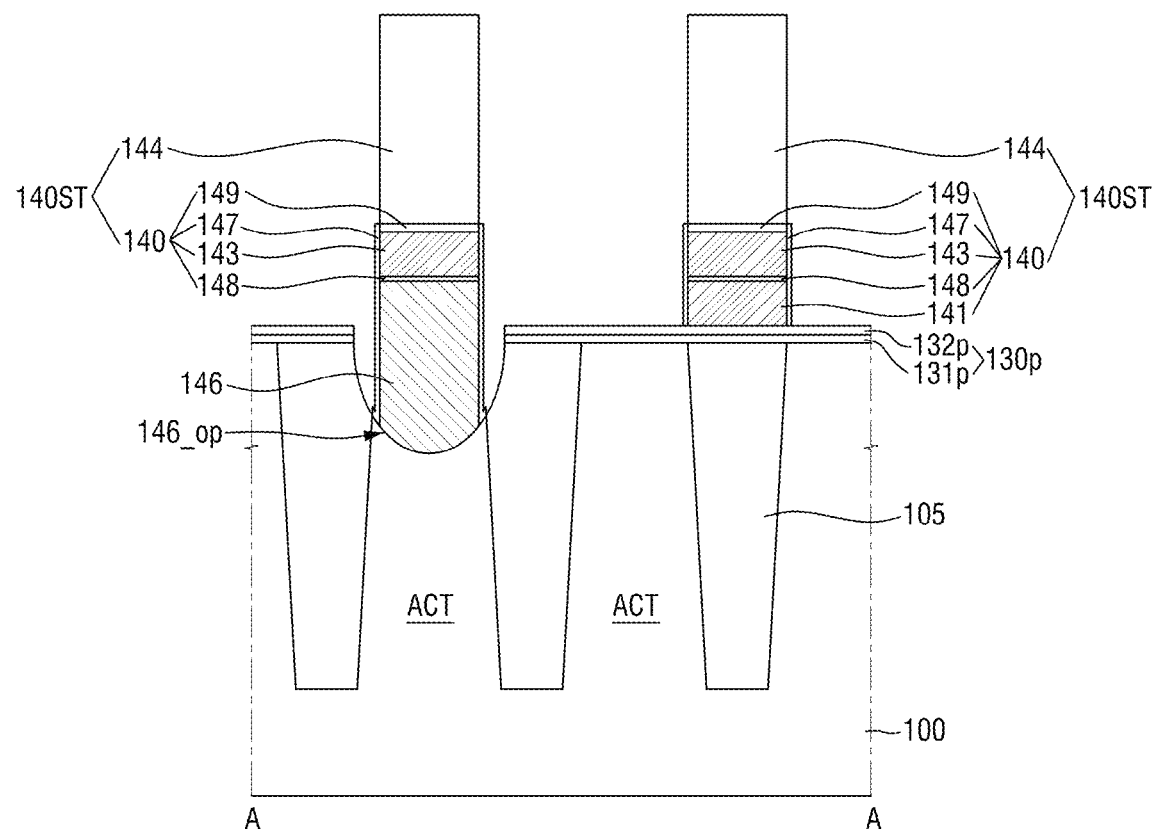

Referring to FIG. 26, the sidewall barrier layer 147 may be formed on the sidewall of the first line wiring 143.

The sidewall barrier layer 147 may be formed on the sidewall of the second line wiring 141, the sidewall of the lower barrier layer 148, and the sidewall of the upper barrier layer 149.

In this way, the wiring structure 140 including the first line wiring 143, the second line wiring 141, the lower barrier layer 148, the upper barrier layer 149, and the sidewall barrier layer 147 may be formed above the substrate 100. Further, the bit line structure 140ST including the wiring structure 140 and the wiring line capping layer 144 may be formed above the substrate 100.

The sidewall barrier layer 147 may be formed on the sidewall of the bit line contact 146. In addition, the sidewall barrier layer 147 may be formed on the substrate 100 exposed through the bit line contact opening 146_op.

As an example, a deposition process of the sidewall barrier layer 147 and the reduction process (described with reference to FIG. 25) for reducing the surface of the first line wiring 143 may be performed in-situ. As another example, the deposition process of the sidewall barrier layer 147 and the reduction process for reducing the surface of the first line wiring 143 may be performed ex-situ.

Figure 27:
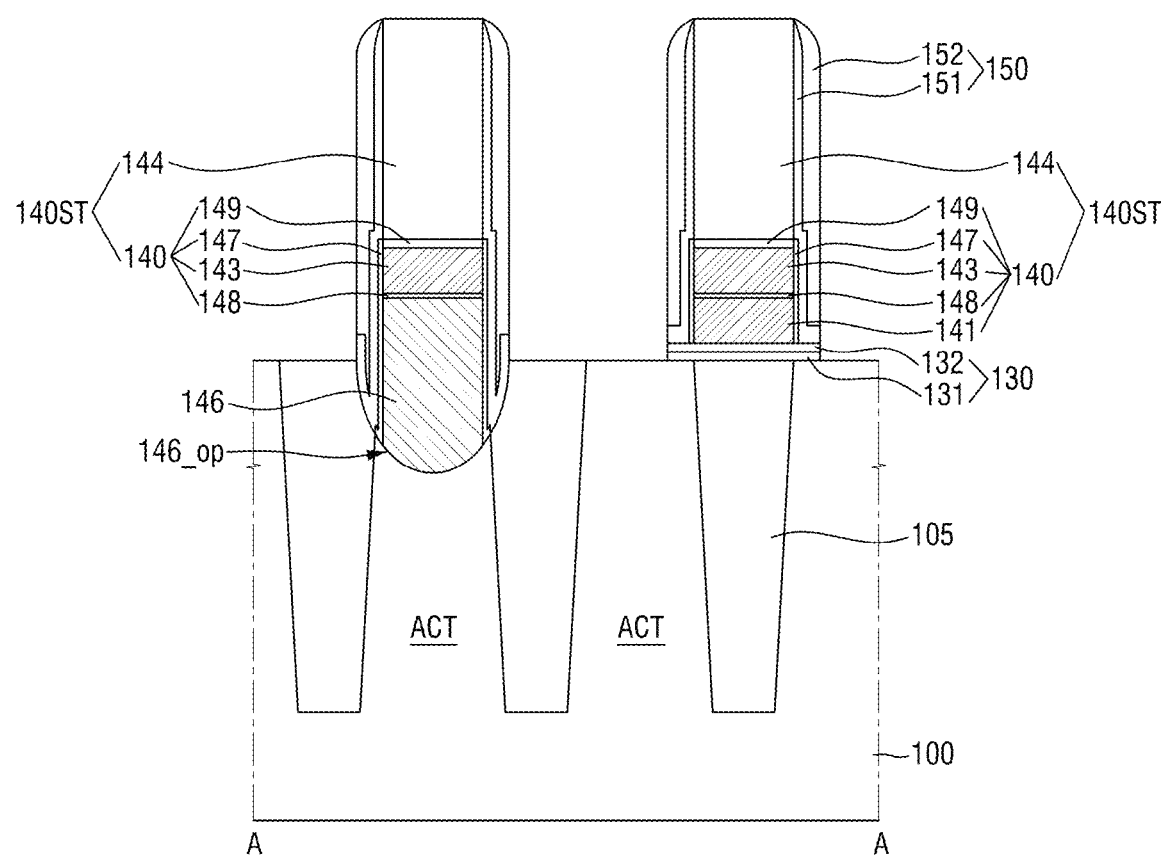

Referring to FIG. 27, the wiring line spacer 150 may be formed on the sidewall of the bit line structure 140ST.

The wiring line spacer 150 may be formed on the element isolation layer 105 and the substrate 100 in a portion of the wiring structure 140 on which the bit line contact 146 is formed. The wiring line spacer 150 may extend in the second direction D2 (see FIG. 1) along the sidewall of the bit line structure 140ST.

The pre-cell insulating layer 130p that does not overlap the bit line structure 140ST and the wiring line spacer 150 may be removed. Between the bit line structures 140ST, the substrate 100 and the element isolation layer 105 may be exposed.

Subsequently, referring to FIG. 18, a part of the substrate 100 and the element isolation layer 105 between the bit line structures 140ST may be removed to form the storage contact 120. Subsequently, the storage pad 160 and the information storage unit 190 may be formed.

Unlike the above, some of the sidewall barrier layer 147, the lower barrier layer 148, and the upper barrier layer 149 may not be formed.

In concluding the detailed description, those of ordinary skill in the art will appreciate that many variations and modifications can be made to example embodiments without substantially departing from the principles of inventive concepts. Therefore, the disclosed example embodiments of inventive concepts are used in a generic and descriptive sense only and not for purposes of limitation.

What is claimed is:

1. A semiconductor device comprising:
   a substrate including an element isolation layer, the element isolation layer defining an active region;
   a plurality of word lines traversing the active region in a first direction; and
   a plurality of bit line structures on the substrate and connected to the active region, the plurality of bit line structures extending in a second direction different from the first direction,
   wherein each of the plurality of bit line structures includes,
      a ruthenium line wiring including a bottom surface and a top surface opposite to the bottom surface,
      a lower graphene layer in contact with the bottom surface of the ruthenium line wiring and extending along the bottom surface of the ruthenium line wiring, and
      a wiring line capping layer extending along the top surface of the ruthenium line wiring, wherein at least one of the plurality of bit line structures includes a sidewall graphene layer extending along a sidewall of the ruthenium line wiring and a sidewall of a first line wiring between the lower graphene layer and the substrate.

2. The semiconductor device of claim 1, further comprising:
   the first line wiring extending along the lower graphene layer.

3. The semiconductor device of claim 2, wherein the first line wiring includes a doped semiconductor material.

4. The semiconductor device of claim 3, further comprising:
   a metal silicide line wiring between the first line wiring and the lower graphene layer.

5. The semiconductor device of claim 2, wherein the first line wiring includes a conductive material, the conductive material including a metal.

6. The semiconductor device of claim 5, further comprising:
a second line wiring between the first line wiring and the substrate and extending along the first line wiring,
wherein the second line wiring includes a doped semiconductor material.

7. The semiconductor device of claim 1, wherein a thickness of the sidewall graphene layer is greater than or equal to a thickness of the lower graphene layer.

8. A semiconductor device comprising:
a substrate including an element isolation layer, the element isolation layer defining an active region;
a plurality of word lines traversing the active region in a first direction; and
a plurality of bit line structures extending in a second direction different from the first direction on the substrate and connected to the active region,
wherein each of the plurality of bit line structures includes,
a ruthenium line wiring including a bottom surface and a top surface opposite to the bottom surface,
an upper graphene layer in contact with the top surface of the ruthenium line wiring and extending along the top surface of the ruthenium line wiring, and
a wiring line capping layer on the upper graphene layer and extending along the upper graphene layer,
wherein at least one of the plurality of bit line structures includes a sidewall graphene layer extending along a sidewall of the ruthenium line wiring and a sidewall of a first line wiring between the ruthenium line wiring and the substrate.

9. The semiconductor device of claim 8, further comprising:
the first line wiring extending along the ruthenium line wiring,
wherein the first line wiring includes a doped semiconductor material.

10. The semiconductor device of claim 9, further comprising:
a metal silicide line wiring between the first line wiring and the ruthenium line wiring.

11. The semiconductor device of claim 8, further comprising:
the first line wiring extending along the ruthenium line wiring,
wherein the first line wiring includes a conductive material, the conductive material including a metal.

12. The semiconductor device of claim 11, further comprising:
a second line wiring between the first line wiring and the substrate and extending along the first line wiring,
wherein the second line wiring includes a doped semiconductor material.

13. The semiconductor device of claim 8, wherein a thickness of the sidewall graphene layer is smaller than or equal to a thickness of the upper graphene layer.

14. A semiconductor device comprising:
a substrate including an element isolation layer, the element isolation layer defining an active region;
a plurality of word lines traversing the active region in a first direction; and
a plurality of bit line structures on the substrate and connected to the active region, the plurality of bit line structures extending in a second direction different from the first direction,
wherein each of the plurality of bit line structures includes,
a ruthenium line wiring including a bottom surface and a top surface opposite to the bottom surface,
a lower graphene layer contacting the bottom surface of the ruthenium line wiring and extending along the bottom surface of the ruthenium line wiring,
an upper graphene layer in contact with the top surface of the ruthenium line wiring and extending along the top surface of the ruthenium line wiring, and
a wiring line capping layer on the upper graphene layer and extending along the upper graphene layer,
wherein at least one of the plurality of bit line structures includes a sidewall graphene layer extending along a sidewall of the ruthenium line wiring and a sidewall of a first line wiring between the lower graphene layer and the substrate.

15. The semiconductor device of claim 14, wherein the first line wiring includes a doped semiconductor material.

16. The semiconductor device of claim 15, further comprising:
a metal silicide line wiring between the first line wiring and the ruthenium line wiring.

17. The semiconductor device of claim 14, wherein the first line wiring includes a conductive material, the conductive material including a metal.

* * * * *